(12) United States Patent
Mangum et al.

(10) Patent No.: US 9,732,274 B2
(45) Date of Patent: Aug. 15, 2017

(54) NANOCRYSTALLINE QUANTUM DOT HETEROSTRUCTURE

(71) Applicant: Pacific Light Technologies Corp., Portland, OR (US)

(72) Inventors: Benjamin Daniel Mangum, Tualatin, OR (US); Nathan Evan Stott, West Linn, OR (US); Norbert Puetz, Ottawa (CA); Juanita N. Kurtin, Hillsboro, OR (US)

(73) Assignee: Pacific Light Technologies Corp., Portland, OR (US)

( * ) Notice: Subject to any disclaimer, the term of this patent is extended or adjusted under 35 U.S.C. 154(b) by 0 days.

(21) Appl. No.: 15/201,217

(22) Filed: Jul. 1, 2016

(65) Prior Publication Data
US 2017/0005226 A1   Jan. 5, 2017

Related U.S. Application Data

(60) Provisional application No. 62/188,321, filed on Jul. 2, 2015.

(51) Int. Cl.
| | |
|---|---|
| C09K 11/88 | (2006.01) |
| C09K 11/02 | (2006.01) |
| B82Y 40/00 | (2011.01) |
| B82Y 20/00 | (2011.01) |
| B82Y 30/00 | (2011.01) |
| H01L 33/50 | (2010.01) |

(52) U.S. Cl.
CPC .......... *C09K 11/883* (2013.01); *C09K 11/025* (2013.01); *B82Y 20/00* (2013.01); *B82Y 30/00* (2013.01); *B82Y 40/00* (2013.01); *H01L 33/502* (2013.01); *Y10S 977/774* (2013.01); *Y10S 977/896* (2013.01); *Y10S 977/95* (2013.01)

(58) Field of Classification Search
CPC ....... H01L 33/04; H01L 33/28; C09K 11/025; C09K 11/883; Y10S 977/896; Y10S 977/95; Y10S 977/774; B82Y 40/00; B82Y 20/00
See application file for complete search history.

(56) References Cited

U.S. PATENT DOCUMENTS

| | | | | |
|---|---|---|---|---|
| 8,396,862 | B2 * | 3/2013 | Sinclair | G06F 17/30463 707/714 |
| 8,721,923 | B2 * | 5/2014 | Wong | B82Y 30/00 252/301.4 P |
| 9,202,867 | B2 * | 12/2015 | Yan | C09K 11/02 |
| 2014/0117311 | A1 * | 5/2014 | Kurtin | H01L 29/127 257/22 |
| 2016/0230088 | A1 * | 8/2016 | Puetz | C09K 11/02 |

OTHER PUBLICATIONS

S.M.Sze Semiconductor Devices Physics and Technology, John Wiley & Sons, ISBN 0-471-87424-8, 1985, pp. 513 Appendix F, Properties of Importan Semiconductors at 300K.*

* cited by examiner

*Primary Examiner* — William Coleman
(74) *Attorney, Agent, or Firm* — Blakely, Sokoloff, Taylor & Zafman, LLP

(57) ABSTRACT

A semiconductor structure includes a nanocrystalline core comprising a first semiconductor material having a first bandgap, and a nanocrystalline shell comprising a second semiconductor material different than the first semiconductor material at least partially surrounding the nanocrystalline core, the second semiconductor material having a second bandgap greater than the first bandgap.

17 Claims, 24 Drawing Sheets

NANOCRYSTALLINE QUANTUM DOT HETEROSTRUCTURE

CROSS-REFERENCE TO RELATED APPLICATIONS

This application claims the benefit of U.S. Provisional Application No. 62/188,321, filed Jul. 2, 2015, the entire contents of which are hereby incorporated by reference herein.

TECHNICAL FIELD

Embodiments of the invention relate to the field of quantum dots for light emitting diodes (LEDs) and other applications and, in particular, a seeded semiconductor rod structure to optimize the functions of absorption and emission of light in a nanocrystalline quantum dot.

BACKGROUND

Quantum dots having a high photoluminescence quantum yield (PLQY) may be applicable as down-converting materials in down-converting nanocomposites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

According to embodiments of the invention, a quantum dot includes a nanocrystalline core and an alloyed nanocrystalline shell made of a semiconductor material composition different from the nanocrystalline core. The alloyed nanocrystalline shell is bonded to and completely surrounds the nanocrystalline core.

DETAILED DESCRIPTION

Alloyed nanocrystals and quantum dots having alloyed nanocrystals are described herein. In the following description, numerous specific details are set forth, such as specific quantum dot compositions, geometries and efficiencies, in order to provide a thorough understanding of embodiments of the invention. It will be apparent to one skilled in the art that embodiments of the invention may be practiced without these specific details. In other instances, well-known related apparatuses, such as the host of varieties of applicable light emitting diodes (LEDs), are not described in detail in order to not unnecessarily obscure embodiments of the invention. Furthermore, it is to be understood that the various embodiments shown in the figures are illustrative representations and are not necessarily drawn to scale.

Disclosed herein are quantum dots having high photoluminescence quantum yields (PLQY's) and methods of making and encapsulating such quantum dots. A high PLQY is achieved by using a synthetic process that significantly reduces the defects and self absorption found in prior art quantum dots. The resulting geometries of the quantum dots may include spherical, prolate spheroidal, and/or ellipsoidal quantum dot cores surrounded with a rod-shaped shell. The aspect or volume ratio of the (core)shell pairing may be controlled by monitoring the reaction process used to fabricate the pairing. Uses of quantum dot compositions having high PLQYs are also disclosed, including solid state lighting. Other applications include biological imaging and fabrication of photovoltaic devices. In other embodiments, alloyed nanocrystals are incorporated as nanocrystalline cores for quantum dots based on heterostructures.

As a reference point, quantum dots based on a spherical cadmium selenide (CdSe) core embedded in a cadmium sulfide (CdS) nanorod shell have been reported. Such quantum dots do not have a high PLQY. Typically, prior art core/shell quantum dots suffer from several structural deficiencies which may contribute to a reduced PLQY. For example, prior art core/shell quantum dots used for downshifting applications typically have overlapping absorption and emission profiles. Profile overlap may be attributed to core material selection such that both the absorption and emission of the quantum dot is controlled by the size, shape, and composition of the core quantum dot, and the shell, if any, is used only as a passivating layer for the surface. However, the prior art arrangement leads to a significant amount of self-absorption (re-absorption of the down-shifted light), which decreases the measured PLQY. Accordingly, a typical prior art core/shell quantum dot PLQY is below 80% which is often not high enough for device applications. Also, prior art core/shell quantum dots suffer from self absorption due in part to inappropriate volume of core/shell material.

Figure 1:
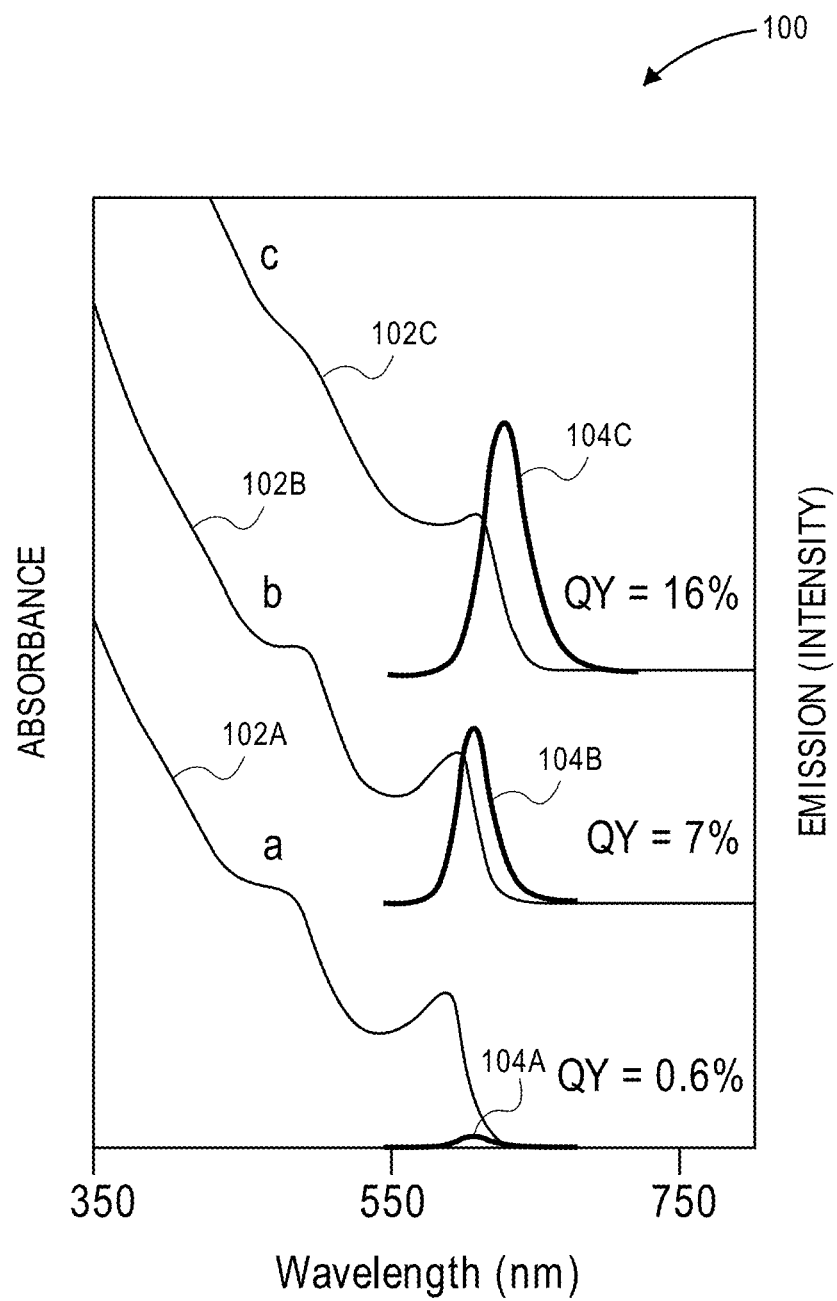
FIG. 1 depicts a plot of prior art core/shell absorption (left y-axis) and emission spectra intensity (right y-axis) as a function of wavelength for conventional quantum dots.

As an example, FIG. 1 depicts a plot 100 of prior art core/shell absorption and emission spectra intensity as a function of wavelength for conventional quantum dots. The absorption spectra (102a, 102b, 102c) are of CdSe core nanorods for a same core size with different thickness shells (a, b, c). FIG. 1 also depicts the emission spectra (104a, 104b, 104c) of the three core/shell quantum dots after exposure to laser light. The absorption spectrum and the emission spectrum overlap for each thickness of shell.

The low PLQY of prior art quantum dots is also attributed to poor nanocrystal surface and crystalline quality. The poor quality may result from a previous lack of capability in synthetic techniques for treating or tailoring the nanocrystal surface in order to achieve PLQYs above 90 percent. For example, the surface may have a large number of dangling bonds which act as trap states to reduce emission and, hence, PLQY. Previous approaches to address such issues have included use of a very thin shell, e.g., approximately ½ monolayer to 5 monolayers, or up to about 1.5 nm of thickness, to preserve the epitaxial nature of the shell. However, a PLQY of only 50-80% has been achieved. In such systems, considerable self-absorption may remain, decreasing the PLQY in many device applications. Other approaches have included attempts to grow a very large volume of up to 19 monolayers, or about 6 nm of shell material on a nanometer-sized quantum dot. However, the results have been less than satisfactory due to mismatched lattice constants between the core and shell material.

Conventionally, a spherical shell is grown on a spherical core in order to fabricate a core/shell quantum dot system. However, if too much volume of shell material is added to the core, the shell often will to crack due to strain. The strain introduces defects and decreases the PLQY. Band-edge emission from the quantum dots is then left to compete with both radiative and non-radiative decay channels, originating from defect electronic states. Attempts have been made to use an organic molecule as a passivating agent in order to improve the size-dependent band-edge luminescence efficiency, while preserving the solubility and processability of the particles. Unfortunately, however, passivation by way of organic molecule passivation is often incomplete or reversible, exposing some regions of the surface of a quantum dot to degradation effects such as photo-oxidation. In some cases, chemical degradation of the ligand molecule itself or its exchange with other ligands results in fabrication of poor quality quantum dots.

One or more embodiments of the invention address at least one or more of the above issues regarding quantum dot quality and behavior and the impact on PLQY of the fabricated quantum dots. In one approach, the quality of quantum dot particle interfaces is improved over conventional systems. For example, in one embodiment, high PLQY temperature stability of a fabricated (e.g., grown) quantum dot is centered on the passivation or elimination of internal (at the seed/rod interface) and external (at the rod surface) interface defects that provide non-radiative recombination pathways for electron-hole pairs that otherwise compete with a desirable radiative recombination. This approach may be generally coincident with maximizing the room-temperature PLQY of the quantum dot particles. Thus, thermal escape paths from the quantum dot, assisted by quantum dot phonons, are mitigated as a primary escape mechanism for thermally excited carriers. Although the chemical or physical nature of such trap states has not been phenomenologically explored, suitably tuning electron density at the surface may deactivate trap states. Such passivation is especially important at increased temperatures, where carriers have sufficient thermal energy to access a larger manifold of these states.

In an embodiment, approaches described herein exploit the concept of trap state deactivation. Furthermore, maintenance of such a deactivation effect over time is achieved by insulating a quantum dot interface and/or outer most surface from an external environment. The deactivation of surface states is also important for the fabrication of polymer composites including quantum dots, particularly in the case where the polymer composite is exposed to a high flux light-source (as is the case for solid state lighting (SSL)) where it is possible for some of the particles to have more than one exciton. The multi-excitons may recombine radiatively or non-radiatively via Auger recombination to a single exciton state. For non-passivated quantum dot systems, the Auger rate increases with particle volume and with exciton population. However, in an embodiment, a thick, high quality, asymmetric shell of (e.g., of CdS) is grown on well-formed seeds (e.g., CdSe) to mitigate Auger rate increase.

One or more embodiments described herein involve an optimized synthesis of core/shell quantum dots. In a specific example, high PLQY and temperature stable quantum dots are fabricated from CdSe/CdS core-shell nanorods. In order to optimize the quantum dots in place of light emitting diode (LED) phosphors, the temperature stability of the quantum dots is enhanced, and the overall PLQY increased. Such improved performance is achieved while maintaining high absorption and narrow emission profiles for the quantum dots. In one such embodiment, materials systems described herein are tailored for separate optimization of absorption and emission by employing a core/shell structure. The core material predominantly controls the emission and the shell material predominantly controls the absorption. The described systems enable separate optimization of absorption and emission and provides very little overlap of the absorption and emission to minimize re-absorption of any emitted light by the quantum dot material (i.e., self-absorption).

Figure 2:
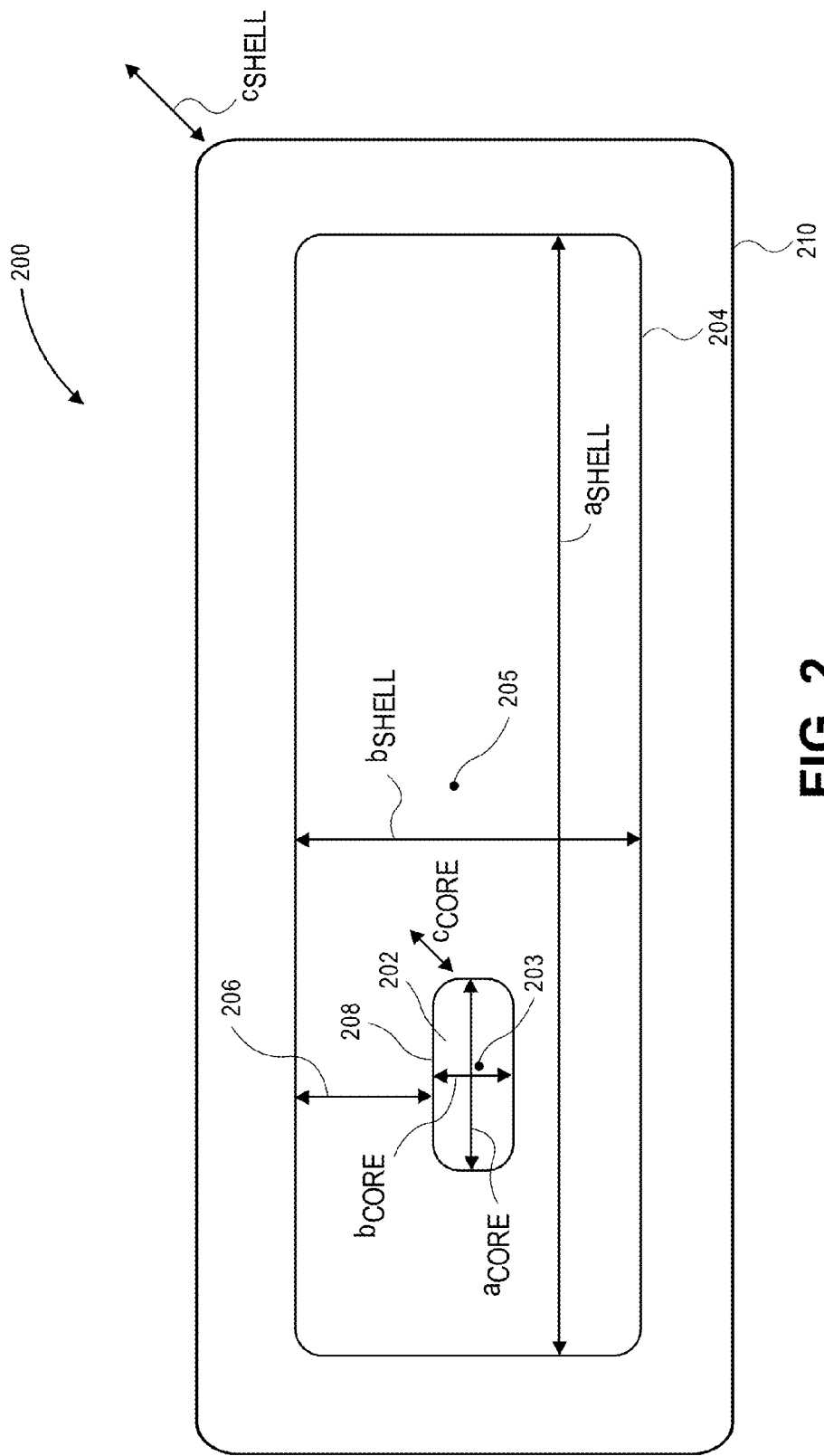
FIG. 2 illustrates a schematic of a cross-sectional view of a quantum dot, in accordance with an embodiment of the invention.

Several factors may be intertwined for establishing an optimized geometry for a quantum dot having a nanocrystalline core and nanocrystalline shell pairing. As a reference, FIG. 2 illustrates a schematic of a cross-sectional view of a quantum dot, in accordance with an embodiment of the invention. Referring to FIG. 2, a semiconductor structure (e.g., a quantum dot structure) 200 includes a nanocrystalline core 202 surrounded by a nanocrystalline shell 204. The nanocrystalline core 202 has a length axis ($a_{CORE}$), a width axis ($b_{CORE}$) and a depth axis ($c_{CORE}$), the depth axis provided into and out of the plane shown in FIG. 2. Likewise, the nanocrystalline shell 204 has a length axis ($a_{SHELL}$), a width axis ($b_{SHELL}$) and a depth axis ($c_{SHELL}$), the depth axis provided into and out of the plane shown in FIG. 2. The nanocrystalline core 202 has a center 203 and the nanocrystalline shell 204 has a center 205. The nanocrystalline shell 204 surrounds the nanocrystalline core 202 in the b-axis direction by an amount 206, as is also depicted in FIG. 2.

In an embodiment, the nanocrystalline shell 204 completely surrounds the nanocrystalline core 202, as depicted in FIG. 2. In an alternative embodiment, however, the nanocrystalline shell 204 only partially surrounds the nanocrystalline core 202, exposing a portion of the nanocrystalline core 202. Furthermore, in either case, the nanocrystalline core 202 may be disposed in an asymmetric orientation with respect to the nanocrystalline shell 204. In one or more embodiments, semiconductor structures such as 200 are fabricated to further include a nanocrystalline outer shell 210 at least partially surrounding the nanocrystalline shell 204. The nanocrystalline outer shell 210 may be composed of a third semiconductor material different from the first and second semiconductor materials, i.e., different from the materials of the core 202 and shell 204. The nanocrystalline outer shell 210 may completely surround the nanocrystalline shell 204 or may only partially surround the nanocrystalline shell 204, exposing a portion of the nanocrystalline shell 204. Additional nanocrystalline shells may also be formed that partially or completely surround the core/shell(s) pairing, further improving the stability of the semiconductor material, for example, by reducing degradation due to emission over time.

The following are attributes of a quantum dot that may be tuned for optimization, with reference to the parameters provided in FIG. 2, in accordance with embodiments of the invention. Nanocrystalline core 202 diameter (a, b or c) and aspect ratio (e.g., a/b) can be controlled for rough tuning for emission wavelength (a higher value for either providing increasingly red emission). A smaller overall nanocrystalline core provides a greater surface to volume ratio. The width of the nanocrystalline shell along 206 may be tuned for yield optimization and quantum confinement providing approaches to control red-shifting and mitigation of surface effects. However, strain considerations must be accounted for when optimizing the value of thickness 206. The length ($a_{SHELL}$) of the shell is tunable to provide longer radiative decay times as well as increased light absorption. The overall aspect ratio of the structure 200 (e.g., the greater of $a_{SHELL}/b_{SHELL}$ and $a_{SHELL}/c_{SHELL}$) may be tuned to directly impact PLQY. Meanwhile, overall surface/volume ratio for 200 may be kept relatively smaller to provide lower surface defects, provide higher photoluminescence, and limit self-absorption. Referring again to FIG. 2, the shell/core interface 208 may be tailored to avoid dislocations and strain sites. In one such embodiment, a high quality interface is obtained by tailoring one or more of injection temperature and mixing parameters, the use of surfactants, and control of the reactivity of precursors, as is described in greater detail below.

In accordance with an embodiment of the invention, a high PLQY quantum dot is based on a core/shell pairing using an anisotropic core. With reference to FIG. 2, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the invention).

A workable range of aspect ratio for an anisotropic nanocrystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

With reference to the above described nanocrystalline core and nanocrystalline shell pairings, in an embodiment, the nanocrystalline shell completely surrounds the anisotropic nanocrystalline core. In an alternative embodiment, however, the nanocrystalline shell only partially surrounds the anisotropic nanocrystalline core, exposing a portion of the anisotropic nanocrystalline core, e.g., as in a tetrapod geometry or arrangement. In an embodiment, the nanocrystalline shell is an anisotropic nanocrystalline shell, such as a nano-rod, that surrounds the anisotropic nanocrystalline core at an interface between the anisotropic nanocrystalline shell and the anisotropic nanocrystalline core. The anisotropic nanocrystalline shell passivates or reduces trap states at the interface. The anisotropic nanocrystalline shell may also, or instead, deactivate trap states at the interface.

With reference again to the above described nanocrystalline core and nanocrystalline shell pairings, in an embodiment, the first and second semiconductor materials (core and shell, respectively) are each materials such as, but not limited to, Group II-VI materials, Group III-V materials, Group IV-VI materials, Group materials, or Group II-IV-VI materials and, in one embodiment, are monocrystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In one embodiment either or both of the first and second semiconductor materials include a Magnesium Chalcogenide and alloyed Group II-VI materials. In an embodiment, the semiconductor structure further includes a nanocrystalline outer shell at least partially surrounding the nanocrystalline shell and, in one embodiment, the nanocrystalline outer shell completely surrounds the nanocrystalline shell. The nanocrystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS). In another embodiment, the first semiconductor material is a Group II-VI material, the second semiconductor material includes a magnesium chalcogenide alloyed with Group II-VI materials, and the third semiconductor material is zinc magnesium sulfide (ZnMgS). In another embodiment, the first semiconductor material is cadmium selenide sulfide (CdSeS), the second semiconductor material is cadmium zinc sulfide (CdZnS), and the third semiconductor material is zinc magnesium sulfide (ZnMgS).

With reference again to the above described nanocrystalline core and nanocrystalline shell pairings, in an embodiment, the semiconductor structure (i.e., the core/shell pairing in total) has an aspect ratio approximately in the range of 1.5-10 and, 3-6 in a particular embodiment. In an embodiment, the nanocrystalline shell has a long axis and a short axis. The long axis has a length approximately in the range of 5-40 nanometers. The short axis has a length approximately in the range of 1-10 nanometers greater than a diameter of the anisotropic nanocrystalline core parallel with the short axis of the nanocrystalline shell. In a specific such embodiment, the anisotropic nanocrystalline core has a diameter approximately in the range of 2-5 nanometers. In another embodiment, the anisotropic nanocrystalline core has a diameter approximately in the range of 2-5 nanometers. The thickness of the nanocrystalline shell on the anisotropic nanocrystalline core along a short axis of the nanocrystalline shell is approximately in the range of 1-5 nanometers of the second semiconductor material.

In yet another embodiment, the anisotropic nanocrystalline core has a diameter approximately in the range of 4 nm along its short axis. The long axis of a rod-shaped nanocrystalline shell encompassing the core has a length approximately in the range of 15-25 nanometers, and the shell has a length approximately in the range of 2-3 nanometers greater than a diameter of the anisotropic nanocrystalline core parallel with the short axis of the nanocrystalline shell.

With reference again to the above-described nanocrystalline core and nanocrystalline shell pairings, in an embodiment, the anisotropic nanocrystalline core and the nanocrystalline shell form a quantum dot. In one such embodiment, the quantum dot has a photoluminescence quantum yield (PLQY) of at least 90%. Emission from the quantum dot may be mostly, or entirely, from the nanocrystalline core. For example, in an embodiment, emission from the anisotropic nanocrystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nanocrystalline core and nanocrystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of color semiconductor structures may be used in devices of the invention. LED devices according to embodiments of the invention may have incorporated therein sufficient quantity of semiconductor structures (e.g., quantum dots) described herein capable of down-converting any available blue light to red, green, yellow, orange, blue, indigo, violet or other color.

Semiconductor structures according to embodiments of the invention may be advantageously used in biological imaging in, e.g., one or more of the following environments: fluorescence resonance energy transfer (FRET) analysis, gene technology, fluorescent labeling of cellular proteins, cell tracking, pathogen and toxin detection, in vivo animal imaging or tumor biology investigation. Accordingly, embodiments of the invention contemplate probes having quantum dots described herein.

Semiconductor structures according to embodiments of the invention may be advantageously used in photovoltaic cells in layers where high PLQY is important. Accordingly, embodiments of the invention contemplate photovoltaic devices using quantum dots described herein.

There are various synthetic approaches for fabricating CdSe quantum dots. For example, in an embodiment, under an inert atmosphere (e.g., ultra high purity (UHP) argon), cadmium oxide (CdO) is dissociated in the presence of surfactant (e.g., octadecylphosphonic acid (ODPA)) and solvent (e.g., trioctylphosphine oxide (TOPO); trioctylphosphine (TOP)) at high temperatures (e.g., 350-380 degrees Celsius). Resulting $Cd^{2+}$ cations are exposed by rapid injection to solvated selenium anions ($Se^{2-}$), resulting in a nucleation event forming small CdSe seeds. The seeds continue to grow, feeding off of the remaining $Cd^{2+}$ and $Se^{2-}$ available in solution, with the resulting quantum dots being stabilized by surface interactions with the surfactant in solution (ODPA). The aspect ratio of the CdSe seeds is typically between 1 and 2, as dictated by the ratio of the ODPA to the Cd concentration in solution. The quality and final size of these cores is affected by several variables such as, but not limited to, reaction time, temperature, reagent concentration, surfactant concentration, moisture content in the reaction, or mixing rate. The reaction is targeted for a narrow size distribution of CdSe seeds (assessed by transmission electron microscopy (TEM)), typically a slightly cylindrical seed shape (also assessed by TEM) and CdSe seeds exhibiting solution stability over time (assessed by PLQY and scattering in solution).

For the cadmium sulfide (CdS) shell growth on the CdSe seeds, or nanocrystalline cores, under an inert atmosphere (e.g. UHP argon), cadmium oxide (CdO) is dissociated in the presence of surfactants (e.g., ODPA and hexylphosphonic acid (HPA)) and solvent (e.g. TOPO and/or TOP) at high temperatures (e.g., 350-380 degrees Celsius). The resulting $Cd^{2+}$ cations in solution are exposed by rapid injection to solvated sulfur anions ($S^{2-}$) and CdSe cores. Immediate growth of the CdS shell around the CdSe core occurs. The use of both a short chain and long chain phosphonic acid promotes enhanced growth rate at along the c-axis of the structure, and slower growth along the a-axis, resulting in a rod-shaped core/shell nanomaterial.

CdSe/CdS core-shell quantum dots have been shown in the literature to exhibit respectable quantum yields (e.g., 70-75%). However, the persistence of surface trap states (which decrease overall photoluminescent quantum yield) in these systems arises from a variety of factors such as, but not limited to, strain at the core-shell interface, high aspect ratios (ratio of rod length to rod width of the core/shell pairing) which lead to larger quantum dot surface area requiring passivation, or poor surface stabilization of the shell.

In order to address the above synthetic limitations on the quality of quantum dots formed under conventional synthetic procedures, in an embodiment, a multi-faceted approach is used to mitigate or eliminate sources of surface trap states in quantum dot materials. For example, lower reaction temperatures during the core/shell pairing growth yields slower growth at the CdSe—CdS interface, giving each material sufficient time to orient into the lowest-strain positions. Aspect ratios are controlled by changing the relative ratios of surfactants in solution as well as by controlling temperature. Increasing an ODPA/HPA ratio in a reaction slows the rapid growth at the ends of the core/shell pairings by replacing the facile HPA surfactant with the more obstructive ODPA surfactant. In addition, lowered reaction temperatures are also used to contribute to slowed growth at the ends of the core/shell pairings. By controlling these variables, the aspect ratio of the core/shell pairing is optimized for quantum yield. In one such embodiment, following determination of optimal surfactant ratios, overall surfactant concentrations are adjusted to locate a PLQY maximum while maintaining long-term stability of the fabricated quantum dots in solution. Furthermore, in an embodiment, aspect ratios of the seed or core (e.g., as opposed to the seed/shell pairing) are limited to a range between, but not including 1.0 and 2.0 in order to provide an appropriate geometry for high quality shell growth thereon.

In another aspect, an additional or alternative strategy for improving the interface between CdSe and CdS includes, in an embodiment, chemically treating the surface of the CdSe cores prior to reaction. CdSe cores are stabilized by long chain surfactants (ODPA) prior to introduction into the CdS growth conditions. Reactive ligand exchange can be used to replace the ODPA surfactants with ligands which are easier to remove (e.g., primary or secondary amines), facilitating improved reaction between the CdSe core and the CdS growth reagents.

In addition to the above factors affecting PLQY in solution, self-absorption may negatively affect PLQY when these materials are cast into films. This phenomenon may occur when CdSe cores re-absorb light emitted by other quantum dots. In one embodiment, the thickness of the CdS shells around the same CdSe cores is increased in order to increase the amount of light absorbed per core/shell pairing, while keeping the particle concentration the same or lower in films including the quantum dot structures. The addition of more Cd and S to the shell formation reaction leads to more shell growth, while an optimal surfactant ratio allows targeting of a desired aspect ratio and solubility of the core/shell pairing.

Accordingly, in an embodiment, an overall method of fabricating a semiconductor structure, such as the above described quantum dot structures, includes forming an anisotropic nanocrystalline core from a first semiconductor material. A nanocrystalline shell is formed from a second, different, semiconductor material to at least partially surround the anisotropic nanocrystalline core. In one such embodiment, the anisotropic nanocrystalline core has an aspect ratio between, but not including, 1.0 and 2.0, as described above.

With reference to the above described general method for fabricating a nanocrystalline core and nanocrystalline shell pairing, in an embodiment, prior to forming the nanocrystalline shell, the anisotropic nanocrystalline core is stabilized in solution with a surfactant. In one such embodiment, the surfactant is octadecylphosphonic acid (ODPA). In another such embodiment, the surfactant acts as a ligand for the anisotropic nanocrystalline core. In that embodiment, the method further includes, prior to forming the nanocrystalline shell, replacing the surfactant ligand with a second ligand, the second ligand more labile than the surfactant ligand. In a specific such embodiment, the second ligand is one such as, but not limited to, a primary amine or a secondary amine.

With reference again to the above described general method for fabricating a nanocrystalline core and nanocrystalline shell pairing, in an embodiment, forming the nanocrystalline shell includes forming the second semiconductor material in the presence of a mixture of surfactants. In one such embodiment, the mixture of surfactants includes a mixture of octadecylphosphonic acid (ODPA) and hexylphosphonic acid (HPA). In a specific such embodiment, forming the nanocrystalline shell includes tuning the aspect ratio of the nanocrystalline shell by tuning the ratio of ODPA versus HPA. Forming the second semiconductor material in the presence of the mixture of surfactants may also, or instead, include using a solvent such as, but not limited to, trioctylphosphine oxide (TOPO) and trioctylphosphine (TOP).

With reference again to the above described general method for fabricating a nanocrystalline core and nanocrystalline shell pairing, in an embodiment, forming the anisotropic nanocrystalline core includes forming at a temperature approximately in the range of 350-380 degrees Celsius. In an embodiment, forming the anisotropic nanocrystalline core includes forming a cadmium selenide (CdSe) nanocrystal from cadmium oxide (CdO) and selenium (Se) in the presence of a surfactant at a temperature approximately in the range of 300-400 degrees Celsius. The reaction is arrested prior to completion. In one such embodiment, forming the nanocrystalline shell includes forming a cadmium sulfide (CdS) nanocrystalline layer on the CdSe nanocrystal from cadmium oxide (CdO) and sulfur (S) at a temperature approximately in the range of 120-380 degrees Celsius. That reaction is also arrested prior to completion.

The aspect ratio of the fabricated semiconductor structures may be controlled by one of several methods. For example, ligand exchange may be used to change the surfactants and/or ligands and alter the growth kinetics of the shell and thus the aspect ratio. Changing the core concentration during core/shell growth may also be exploited. An increase in core concentration and/or decrease concentration of surfactants results in lower aspect ratio core/shell pairings. Increasing the concentration of a shell material such as S for CdS will increase the rate of growth on the ends of the core/shell pairings, leading to longer, higher aspect ratio core/shell pairings.

As mentioned above, in one embodiment of the invention, nanocrystalline cores undergo a reactive ligand exchange which replaces core surfactants with ligands that are easier to remove (e.g., primary or secondary amines), facilitating better reaction between the CdSe core and the CdS growth reagents. In one embodiment, cores used herein have ligands bound or associated therewith. Attachment may be by dative bonding, Van der Waals forces, covalent bonding, ionic bonding or other force or bond, and combinations thereof. Ligands used with the cores may include one or more functional groups to bind to the surface of the nanocrystals. In a specific such embodiment, the ligands have a functional group with an affinity for a hydrophobic solvent.

In an embodiment, lower reaction temperatures during shell growth yields slower growth at the core/shell interface. While not wishing to be bound by any particular theory or principle it is believed that this method allows both core and shell seed crystals time to orient into their lowest-strain positions during growth. Growth at the ends of the core/shell pairing structure is facile and is primarily governed by the concentration of available precursors (e.g., for a shell of CdS this is Cd, S:TOP). Growth at the sides of the core/shell pairings is more strongly affected by the stabilizing ligands on the surface of the core/shell pairing. Ligands may exist in equilibrium between the reaction solution and the surface of the core/shell pairing structure. Lower reaction temperatures may tilt this equilibrium towards more ligands being on the surface, rendering it more difficult for growth precursors to access this surface. Hence, growth in the width direction is hindered by lower temperature, leading to higher aspect ratio core/shell pairings.

In general consideration of the above described semiconductor or quantum dot structures and methods of fabricating such semiconductor or quantum dot structures, in an embodiment, quantum dots are fabricated to have an absorbance in the blue or ultra-violet (V) regime, with an emission in the visible (e.g., red, orange, yellow, green, blue, indigo and violet, but particularly red and green) regime. The above described quantum dots may advantageously have a high PLQY with limited self-absorption, possess a narrow size distribution for cores, provide core stability over time (e.g., as assessed by PLQY and scattering in solution), and exhibit no major product loss during purification steps. Quantum dots fabricated according one or more of the above embodiments may have a decoupled absorption and emission regime, where the absorption is controlled by the shell and the emission is controlled by the core. In one such embodiment, the diameter of the core correlates with emission color, e.g., a core diameter progressing from 3-5.5 nanometers correlates approximately to a green→yellow→red emission progression.

With reference to the above described embodiments concerning semiconductor structures, such as quantum dots, and methods of fabricating such structures, the concept of a crystal defect, or mitigation thereof, may be implicated. For example, a crystal defect may form in, or be precluded from forming in, a nanocrystalline core or in a nanocrystalline shell, at an interface of the core/shell pairing, or at the surface of the core or shell. In an embodiment, a crystal defect is a departure from crystal symmetry caused by one or more of free surfaces, disorders, impurities, vacancies and interstitials, dislocations, lattice vibrations, or grain boundaries. Such a departure may be referred to as a structural defect or lattice defect. Reference to an exciton is to a mobile concentration of energy in a crystal formed by an excited electron and an associated hole. An exciton peak is defined as the peak in an absorption spectrum correlating to the minimum energy for a ground state electron to cross the bandgap. The core/shell quantum dot absorption spectrum appears as a series of overlapping peaks that get larger at shorter wavelengths. Because of their discrete electron energy levels, each peak corresponds to an energy transition between discrete electron-hole (exciton) energy levels. The quantum dots do not absorb light that has a wavelength longer than that of the first exciton peak, also referred to as the absorption onset. The wavelength of the first exciton peak, and all subsequent peaks, is a function of the composition and size of the quantum dot. An absorbance ratio is absorbance of the core/shell nanocrystal at 400 nm divided by the absorbance of the core/shell nanocrystal at the first exciton peak. Photoluminescence quantum yield (PLQY) is defined as the ratio of the number of photons emitted to the number of photons absorbed. Core/shell pairing described herein may have a Type I band alignment, e.g., the core bandgap is nested within the bandgap of the shell. Emission wavelength may be determined by controlling the size and shape of the core nanocrystal, which controls the bandgap of the core. Emission wavelength may also be engineered by controlling the size and shape of the shell. In an embodiment, the amount/volume of shell material is much greater than that of the core material. Consequently, the absorption onset wavelength is mainly controlled by the shell bandgap. Core/shell quantum dots in accordance with an embodiment of the invention have an electron-hole pair generated in the shell which is then funneled into the core, resulting in recombination and emission from the core quantum dot. Preferably emission is substantially from the core of the quantum dot.

Figure 3:
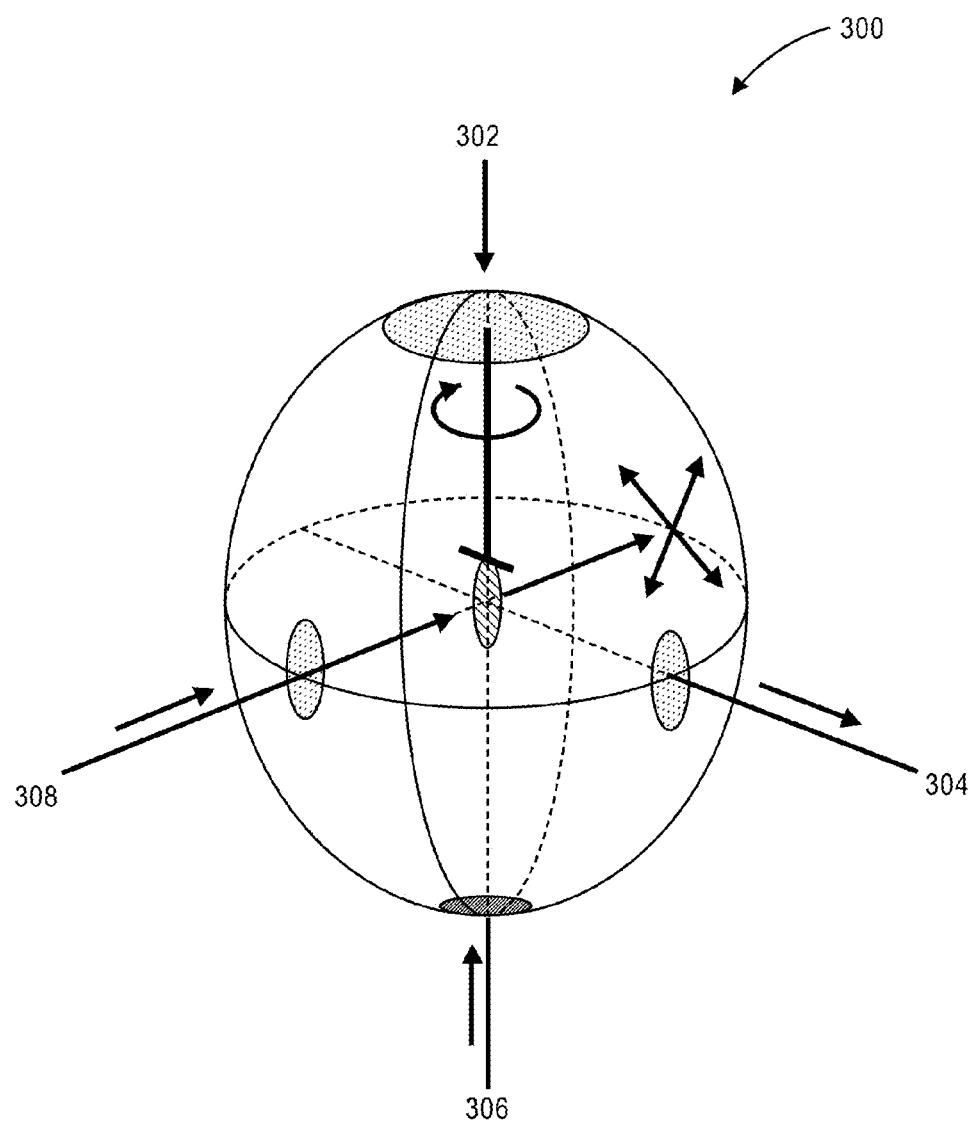
FIG. 3 illustrates a schematic of an integrating sphere for measuring absolute photoluminescence quantum yield, in accordance with an embodiment of the invention.
Figure 4:
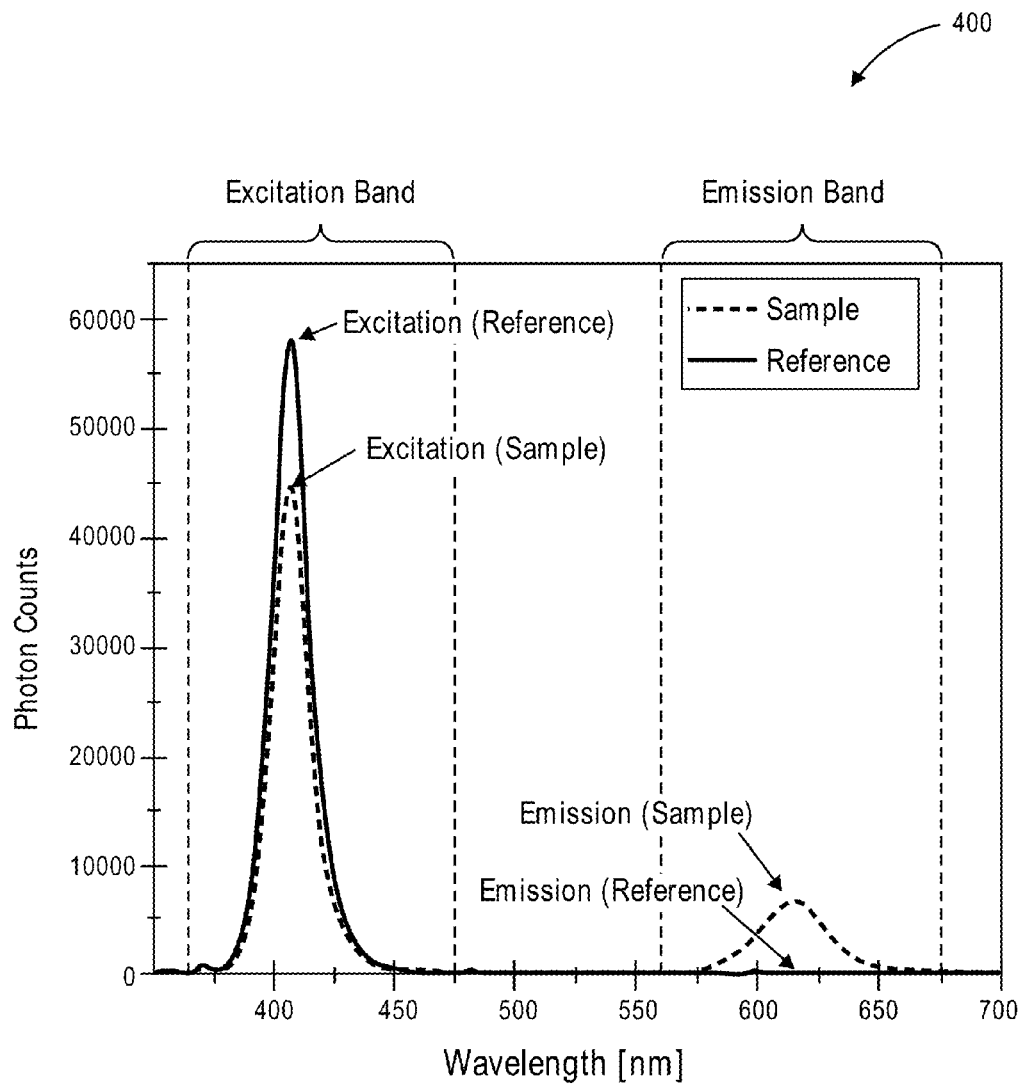
FIG. 4 is a plot of photon counts as a function of wavelength in nanometers for sample and reference emission spectra used in the measurement of photoluminescence quantum yield, in accordance with an embodiment of the invention.

Measurement of Photoluminescence Quantum Yield (PLQY) may be performed according to the method disclosed in Laurent Porres et al. "Absolute Measurements of Photoluminescence Quantum Yields of Solutions Using an Integrating Sphere", *Journal of Fluorescence* (2006) DOI: 10.1007/s10895-005-0054-8, Springer Science+Business Media, Inc. As an example, FIG. 3 illustrates a schematic of an integrating sphere 300 for measuring absolute photoluminescence quantum yield, in accordance with an embodiment of the invention. The integrating sphere 300 includes a sample holder 302, a spectrometer 304, a calibrated light source 306 and an ultra-violet (UV) LED 308. FIG. 4 is a plot 400 of photon counts as a function of wavelength in nanometers for sample and reference emission spectra used in the measurement of photoluminescence quantum yield, in accordance with an embodiment of the invention. Referring to plot 400, both excitation and emission peaks for a sample are calibrated against corresponding excitation and emission peaks for a reference.

In an embodiment, PLQY is measured with a Labsphere™ 6" integrating sphere, a Labsphere™ LPS-100-0105 calibrated white light source, a 3.8 W, 405 nm Thorlabs™ M405L2 UV LED and an Ocean Optics™ USB4000-VIS-NIR spectrometer. The spectrometer and UV LED are coupled into the sphere using Ocean Optics™ UV-Vis optical fibers. The spectrometer fiber is attached to a lens in a port at the side of the sphere at 90 degrees relative to the excitation source. The lens is behind a flat baffle to ensure only diffuse light reaches the lens. The calibrated white light source is affixed to a port in the side of the sphere, at 90° to both the excitation source and the spectrometer port. Custom made sample holders are used to hold solid and solution (cuvette) samples and to rotate samples between direct and indirect measurement positions. Sample holders are coated with a barium sulfate diffuse reflective material. Before measurements are recorded, the calibrated white light source is used to calibrate the spectrometer as a function of wavelength (translating counts per second into relative intensity vs. wavelength). To measure PLQY, a reference sample is inserted into the sphere, and the excitation source LED signal is recorded. This reference sample is generally a blank, such as a cuvette containing a solvent or a sample without quantum dots, so as to only measure the properties of the quantum dots. If it is desirable to measure the properties of the matrix, the blank may be only the substrate. The sample is then inserted into the sphere, in direct beam line for direct measurements, and out of the beam for indirect measurements. The spectrum is recorded and split into excitation and emission bands, each is integrated, and the number of photons emitted per photons absorbed is the photoluminescence quantum yield (PLQY), which is equal to the difference between sample emission and reference emission divided by the difference of reference excitation and sample excitation.

Figure 5:
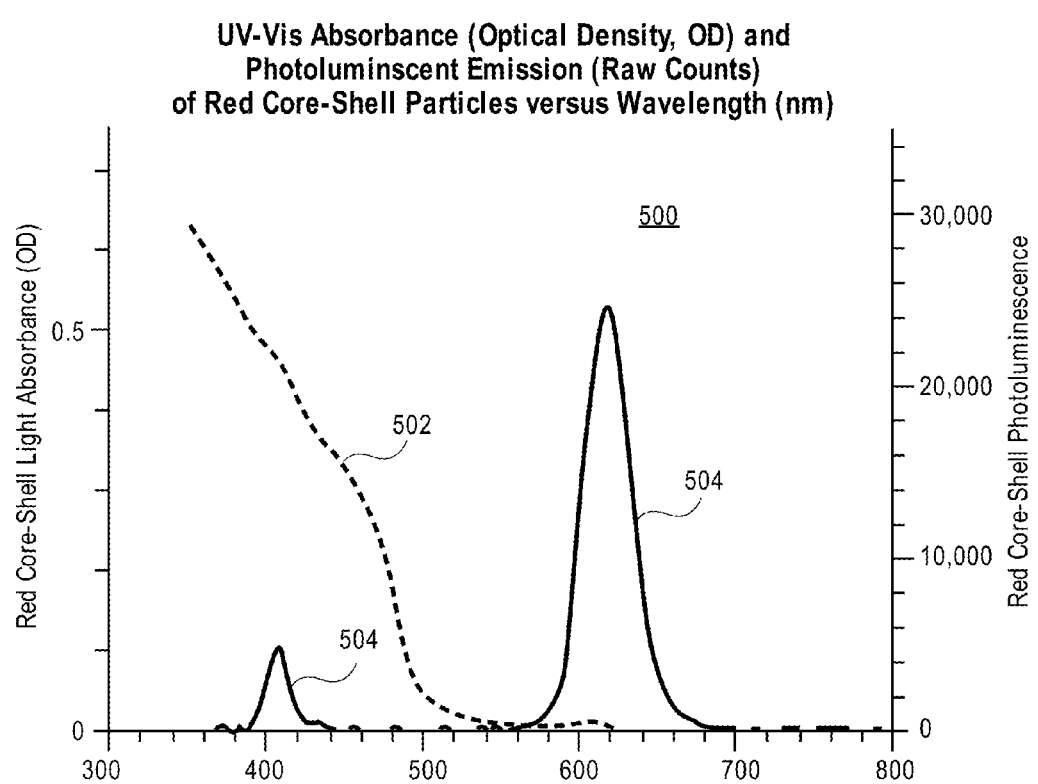
FIG. 5 is a plot including a UV-Vis absorbance spectrum and photoluminescent emission spectrum for red CdSe/CdS core/shell quantum dots, in accordance with an embodiment of the invention.
Figure 6:
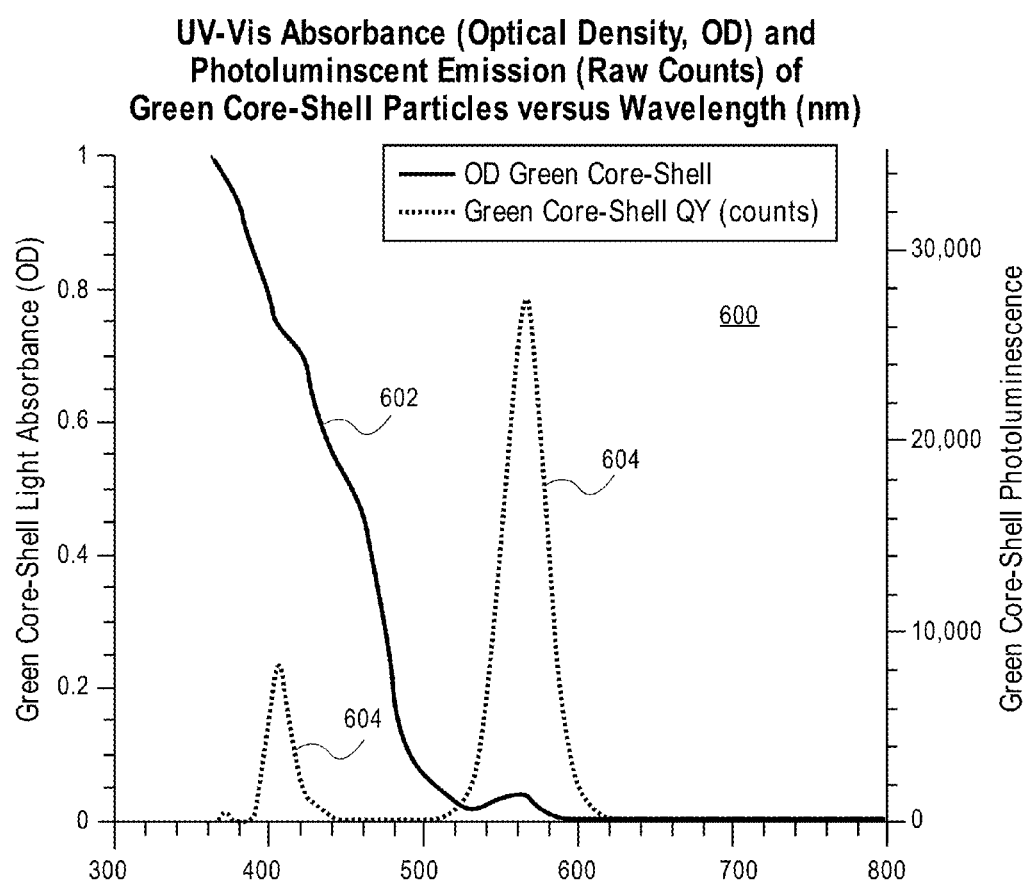
FIG. 6 is a plot including a UV-Vis absorbance spectrum and photoluminescent emission spectrum for a green CdSe/CdS core/shell quantum dot, in accordance with an embodiment of the invention.

Quantum dots according to embodiments of the invention have a PLQY between 90-100%, or at least 90%, more preferably at least 91%, more preferably at least 92%, more preferably at least 93%, more preferably at least 94%, more preferably at least 95%, more preferably at least 96%, more preferably at least 97%, more preferably at least 98%, more preferably at least 99% and most preferably 100%. FIG. 5 is a plot 500 including a UV-Vis absorbance spectrum 502 and photoluminescent emission spectrum 504 for red CdSe/CdS core/shell quantum dots, in accordance with an embodiment of the invention. The quantum dots have essentially no overlapping absorption and emission bands and having an absorbance ratio of about 24. The PLQY was determined to be 94% at 617 nm. The average length (from transmission electron microscopy (TEM) data) is 27 nm±3.3 nm. The average width (from TEM data) is 7.9 nm±1.1 nm. The average aspect ratio (from TEM data) is 3.5±0.6. FIG. 6 is a plot 600 including a UV-Vis absorbance spectrum 602 and photoluminescent emission spectrum 604 for a green CdSe/CdS core/shell quantum dot, in accordance with an embodiment of the invention. The quantum dot has a small extent of overlapping absorption and emission bands and has an absorbance ratio of 16 (plus or minus one).

In another aspect, semiconductor structures having a nanocrystalline core and corresponding nanocrystalline shell and insulator coating are described. Particularly, coated quantum dots structures and methods of making such structures are described below. In an embodiment, core/shell quantum dots are coated with silica by a method resulting in compositions having photoluminescence quantum yields between 90 and 100%. In one such embodiment, semiconductor structures are coated with silica using a reverse micelle method. A quantum dot may be engineered so that emission is substantially from the core.

Prior art quantum dots may have poor nanocrystal surface and crystalline quality as a result of prior art synthetic techniques not being capable of treating the nanocrystal surface in ways capable of achieving PLQYs above 90 percent. For example, the surface of a nanocrystalline core/shell pairing may have a large number of dangling bonds which act as trap states reducing emission and, therefore, PLQY. Prior art techniques to modify the quantum dot surface include coating quantum dots with silica. However, prior art silica coated quantum dots do not achieve the PLQY necessary for continued use in solid state lighting devices.

In conventional approaches, silica coatings can encapsulate more than one particle (e.g., quantum dot structure) at a time, or the approaches have resulted in incomplete encapsulation. One such conventional approach included coating a quantum dot with silica using self-assembled micelles. The approach requires the presence of a majority of a polar solvent to form a micelle. The requirement is for polar solvent environments to generate the encapsulating micelle, and thus limits the technique to aqueous based applications, such as biological tagging and imaging. Quantum dots with a hydrophobic surfactant or ligand attached are aqueous solution insoluble and thus silica cannot be precipitated with the nanocrystals within the aqueous domains of the micro emulsion. Ligand exchange reactions may be required which then leads to surface quality degradation. However, conventional quantum dot systems often rely on the weak dative Van der Waals bonding of ligands such as phosphonic acids, amines, and carboxylic acids to maintain the structures in solution and protect and passivate the surface of the quantum dot.

The integration of a quantum dot into a product may require protection for chemical compatibility with the solution environment during processing, and ultimately the plastic or gel used for encapsulation. Without such compatibility, particles are likely to aggregate and/or redistribute themselves within the matrix, an unacceptable occurrence in, for example, a solid state lighting product. Protection of the surface and maintenance of an electronically uniform environment also ensures that the density of non-radiative pathways (traps) is minimized, and that the emission energy (color) is as uniform as possible. Furthermore, the surface is protected from further chemical reaction with environmental degradants such as oxygen. This is particularly important for LED applications, where the quantum dot must tolerate temperatures as high as 200 degrees Celsius and constant high-intensity illumination with high-energy light. However, the weak surface bonding of prior art quantum dot ligands are non-ideal for the processing and long-term performance required of an LED product, as they allow degradants access to the quantum dot surface.

In accordance with an embodiment of the invention, core/shell quantum dots coated with silica and other ligands to provide a structure having a high PLQY. One embodiment exploits a sol-gel process which encapsulates each quantum dot individually in a silica shell, resulting in a very stable high PLQY quantum dot particle. The coated quantum dots disclosed herein may advantageously possess a narrow size distribution for CdSe core stability over time (assessed by PLQY and scattering in solution).

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. As illustrated in FIG. 2, an additional, outer nanocrystalline shell 210, composed of a third semiconductor material, different from the second semiconductor material, may be formed that surrounds the core/shell pairing. Indeed, although not illustrated in FIG. 2, multiple additional shells may be formed, surrounding the core/shell(s). An insulator layer encapsulates, e.g., coats, the nanocrystalline shell(s) and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell(s) form a quantum dot.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer. In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica ($SiO_x$), titanium oxide ($TiO_x$), zirconium oxide ($ZrO_x$), alumina ($AlO_x$), or hafnia ($HfO_x$). In one such embodiment, the layer is a layer of silica having a thickness approximately in the range of 3-30 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand-functionalized with a ligand such as, but not limited to, mono-, di-, or tri-alkoxysilanes with three, two or one inert or organofunctional substituents of the general formula $(R^1O)_3SiR^2$; $(R^1O)_2SiR^2R^3$; $(R^1O) SiR^2R^3R^4$, where $R^1$ is methyl, ethyl, propyl, isopropyl, or butyl, $R^2$, $R^3$ and $R^4$ are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, methacrylates, epoxies, ethers, aldehydes, carboxylates, esters, anhydrides, phosphates, phosphines, mercaptos, thiols, sulfonates, and are linear or cyclic, a silane with the general structure $(R^1O)_3Si—(CH_2)_n—R—(CH_2)_n—Si(RO)_3$ where R and $R^1$ is H or an organic substituent selected from the group consisting of alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, methacrylates, epoxies, ethers, aldehydes, carboxylates, esters, anhydrides, phosphates, phosphines, mercaptos, thiols, sulfonates, and are linear or cyclic, a chlorosilane, or an azasilane. In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes $(MeO)_3SiAllyl$, $(MeO)_3SiVinyl$, $(MeO)_2SiMeVinyl$, $(EtO)_3SiVinyl$, $EtOSi(Vinyl)_3$, mono-methoxy silanes, chloro-silanes, or 1,2-bis-(triethoxysilyl)ethane. In any case, in an embodiment, the outer surface of the insulator layer is ligand-functionalized to impart solubility, dispersability, heat stability, photostability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-5 nanometers. The nanocrystalline shell has a long axis and a short axis, the long axis having a length approximately in the range of 5-40 nanometers, and the short axis having a length approximately in the range of 1-5 nanometers greater than the diameter of the nanocrystalline core. The insulator layer has a thickness approximately in the range of 1-20 nanometers along an axis co-axial with the long axis and has a thickness approximately in the range of 3-30 nanometers along an axis co-axial with the short axis.

A lighting apparatus may include a light emitting diode and a plurality of semiconductor structures which, e.g., act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution.

Figure 7:
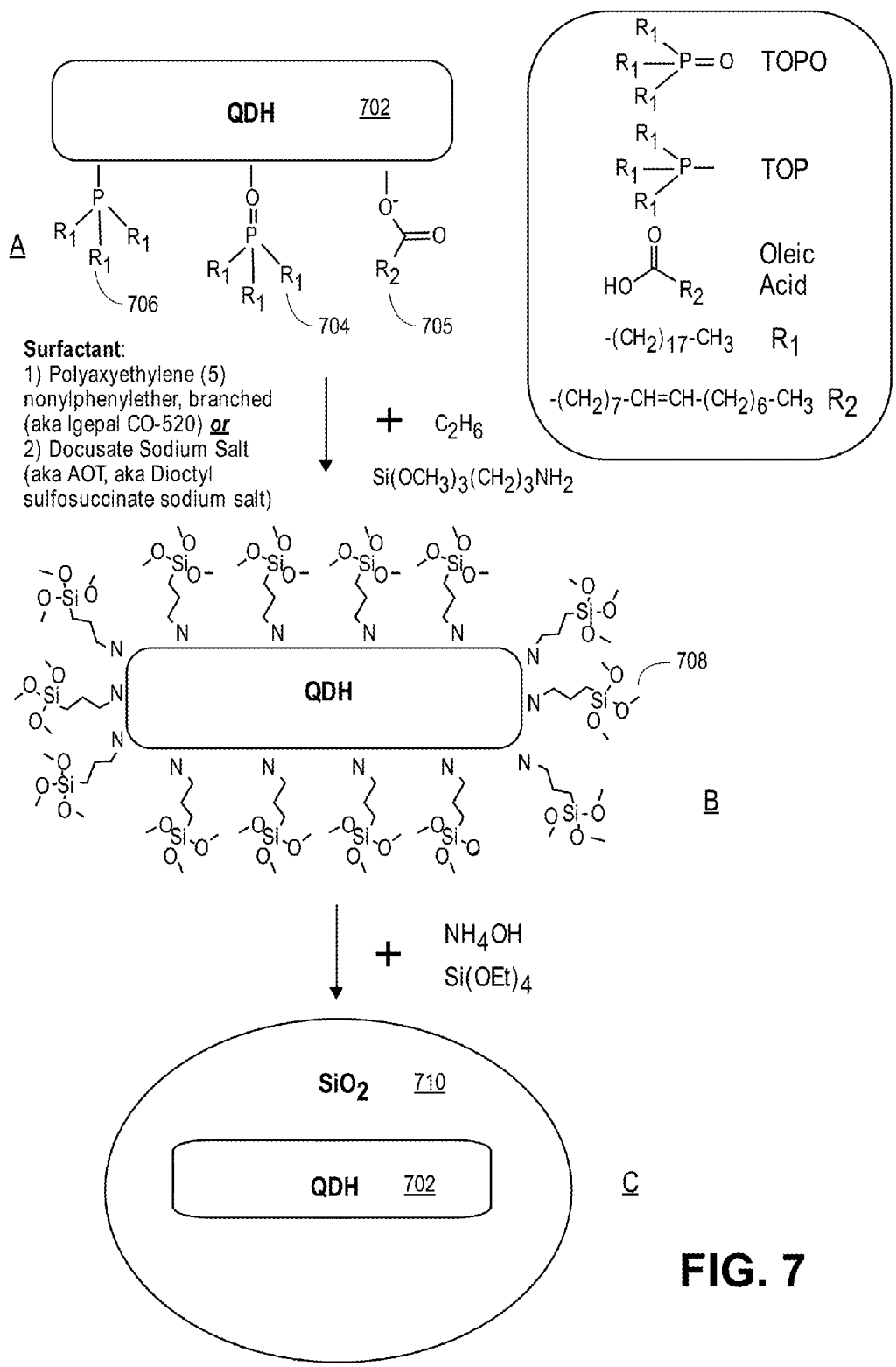
FIG. 7 illustrates operations in a reverse micelle approach to coating a semiconductor structure, in accordance with an embodiment of the invention.
Figure 8:
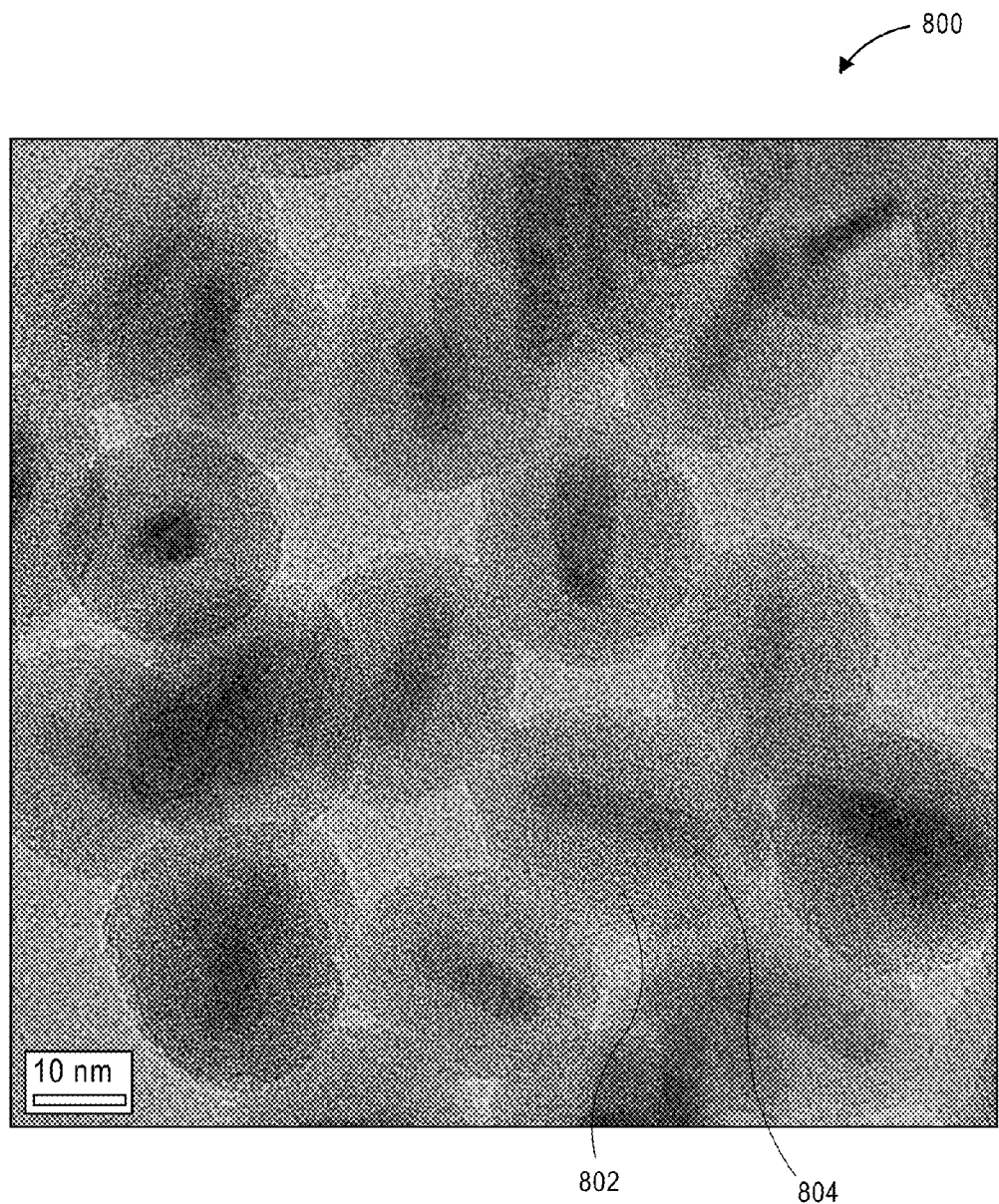
FIG. 8 is a transmission electron microscope (TEM) image of silica coated CdSe/CdS core/shell quantum dots having complete silica encapsulation, in accordance with an embodiment of the invention.

Thus, semiconductor nanocrystals coated with silica according to the invention may be made by a sol-gel reaction such as a reverse micelle method. As an example, FIG. 7 illustrates operations in a reverse micelle approach to coating a semiconductor structure, in accordance with an embodiment of the invention. Referring to part A of FIG. 7, a quantum dot heterostructure (QDH) 702 (e.g., a nanocrystalline core/shell pairing) has attached thereto a plurality of TOPO ligands 704, TOP ligands 706, and Oleic Acid 705. Referring to part B, the plurality of TOPO ligands 704, TOP ligands 706, and Oleic Acid 705 are exchanged with a plurality of $Si(OCH_3)_3(CH_2)_3NH_2$ ligands 708. The structure of part B is then reacted with TEOS $(Si(OEt)_4)$ and ammonium hydroxide ($NH_4OH$) to form a silica coating 710 surrounding the QDH 702, as depicted in part C of FIG. 7. FIG. 8 is a transmission electron microscope (TEM) image 800 of silica coated 802 CdSe/CdS core/shell quantum dots 804 having complete silica encapsulation, in accordance with an embodiment of the invention. Thus, a reverse micelle is formed after adding ammonium hydroxide and tetraethylorthosilicate (TEOS), the source for the silica coating. TEOS diffuses through the micelle and is hydrolyzed by ammonia to form a uniform $SiO_2$ shell on the surface of the quantum dot. This approach may offer great flexibility to incorporate quantum dots of different sizes. In one such embodiment, the thickness of the insulator layer formed depends on the amount of TEOS added to the second solution.

With reference again to the above described method of forming coated nanocrystalline core and nanocrystalline shell pairings, in an embodiment, the first and second non-polar solvents are cyclohexane. In an embodiment, forming the coating layer includes forming a layer of silica and further includes using a combination of dioctyl sodium sulfosuccinate (AOT) and tetraorthosilicate (TEOS). In another embodiment, however, forming the layer includes forming a layer of silica and further includes using a combination of polyoxyethylene (5) nonylphenylether and tetraorthosilicate (TEOS). In another embodiment, however, forming the layer includes forming a layer of silica and further includes using cationic surfactants such as CTAB (cetyltrimethylammonium bromide), anionic surfactants, non-ionic surfactants, or pluronic surfactants such as Pluronic F 127 (an ethylene oxide/propylene oxide block co-polymer) as well as mixtures of surfactants.

Upon initiation of growth of a silica shell, the final size of that shell may be directly related to the amount of TEOS in the reaction solution. Silica coatings according to embodiments of the invention may be conformal to the core/shell QDH or non-conformal. A silica coating may be between about 3 nm and 30 nm thick. The silica coating thickness along the c-axis may be as small as about 1 nm or as large as about 20 nm. The silica coating thickness along the a-axis may be between about 3 nm and 30 nm. Once silica shelling is complete, the product is washed with solvent to remove any remaining ligands. The silica coated quantum dots can then be incorporated into a polymer matrix or undergo further surface functionalization. However, silica shells according to embodiments of the invention may also be functionalized with ligands to impart solubility, dispersability, heat stability and photo-stability in the matrix.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Composites formed by conventional approaches typically suffer from non-uniform dispersion of quantum dots throughout the matrix material which can result in particle agglomeration. Agglomeration may be so severe as to result in emission quenching reducing light output. Another problem is lack of compatibility between the quantum dots and the matrix reduces composite performance. Lack of materials compatibility may introduce a discontinuity at the polymer/quantum dot interface where composite failure may initiate when it is deployed in ordinary use.

Accordingly, there remains a need for a composite material having a quantum dot composition in a matrix that is strong, resistant to thermal degradation, resistant to chemical degradation, provides good adhesion between the coated quantum dot and coupling agent and provides good adhesion between the coupling agent and the polymer matrix. Embodiments described below include quantum dots incorporated into composite matrixes to produce high refractive index films having a high PLQY suitable for solid state device lighting including light emitting diodes.

In an embodiment, an approach for incorporating quantum dots into matrix materials includes coating the quantum dot with a silica shell and reacting the silica shell with a silane coupling agent having two reactive functionalities under the proper conditions. Such an arrangement drives a condensation reaction, binding one end of the silane to the silica surface and leaving the other end of the molecule exposed for integration into a matrix. Other approaches include using a curable material such as metal oxide nanocrystals in a matrix material. In the curable material, metal oxide nanocrystals are linked to a polymer matrix via titanate or a zirconate coupling agents as well as a silane coupling agent, where the metal atoms of the coupling agent link to the oxygen atoms of the metal oxide nanocrystals. Since metal oxides generally do not have a higher refractive index, the curable material incorporating the metal oxide nanocrystals typically can not achieve a refractive index sufficient to improve the light extraction efficiency of photons emitted by an LED in a solid-state device. A high refractive index material including zinc sulfide (ZnS) in a matrix material is another approach attempted. In making the high refractive index material, ZnS colloids are synthesized with ligands having hydroxyl functional groups that are linked to isocyanate function groups present on an oligomer backbone in the matrix material.

In a general embodiment, a composite includes a matrix material. A plurality of semiconductor structures (e.g., quantum dot structures having a coated or non-coated core/shell pairing, such as the structures described above) is embedded in the matrix material. In an embodiment, a lighting apparatus includes a light emitting diode and a composite coating the light emitting diode. The composite may be formed by embedding quantum dots in a matrix material described below.

Figure 9A:
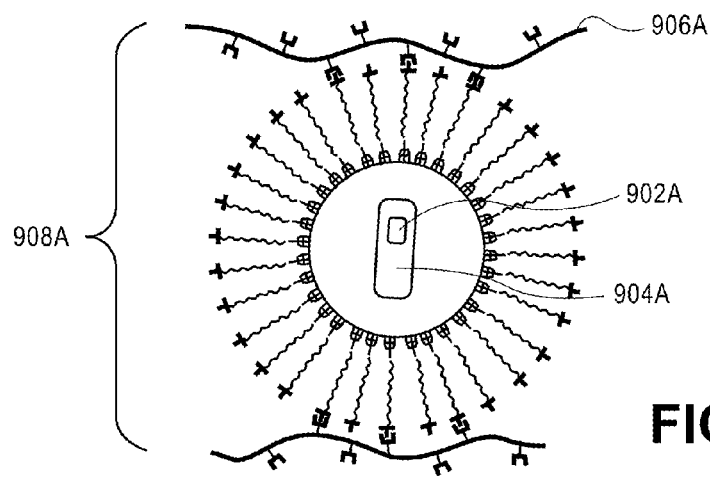
FIGS. 9A-9C illustrate schematic representations of possible composite compositions for quantum dot integration, in accordance with an embodiment of the invention.
Figure 9B:
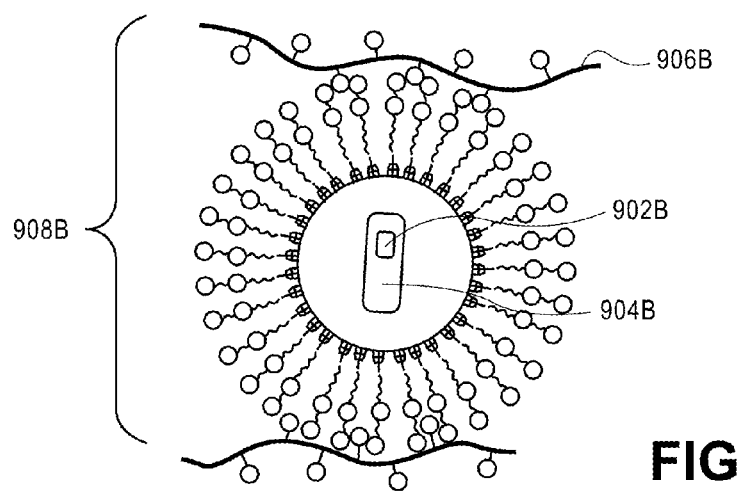
Figure 9C:
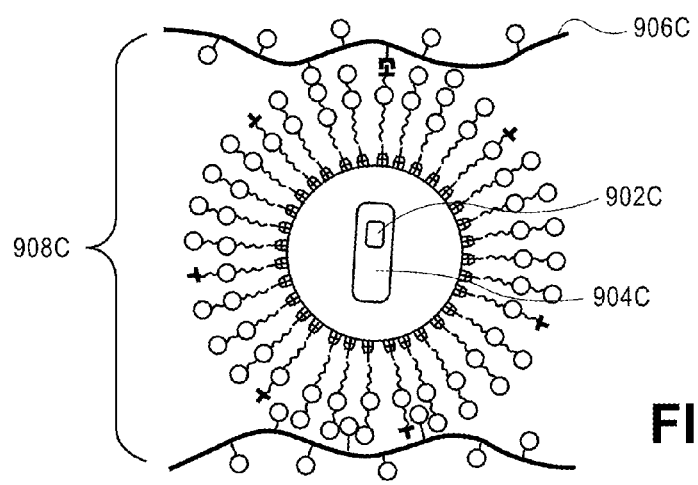

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 9A-9C illustrate schematic representations of possible composite compositions for quantum dot integration, in accordance with an embodiment of the invention. Referring to FIG. 9A, a nanocrystalline core 902A and shell 904A pairing is incorporated into a polymer matrix 906A by active cross-linking through multiple and interchain binding to form a cross-linked composition 908A. Referring to FIG.

9B, a nanocrystalline core 902B and shell 904B pairing is incorporated into a polymer matrix 906B by polarity-based chemical similarity and dissolution to form a polarity based composition 908B. Referring to FIG. 9C, a nanocrystalline core 902C and shell 904C pairing is incorporated into a polymer matrix 906C by reactive tethering by sparse binding and chemical similarity to form a reactive tethering based composition 908C.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nanoparticle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides dispersed uniformly throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Because the functional groups involved are typically polar in nature, the coupling agent tends to be hydrophilic and readily dispersed in an aqueous size composition.

Matrix materials suitable for embodiments of the invention may satisfy the following criteria: they may be optically clear having transmission in the 400-700 nm range of greater than 90%, as measured in a UV-Vis spectrometer. They may have a high refractive index between about 1.0 and 2.0, preferably above 1.4 in the 400-700 nm range. They may have good adhesion to an LED surface if required and/or are sufficiently rigid for self-supporting applications. They may able to maintain their properties over a large temperature range, for example −40° C. to 150° C. and over a long period of time (over 50,000 hours at a light intensity typically 1-10 w/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor structures embedded the semiconductor structures in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

In another aspect, alloyed nanocrystals may be incorporated as nanocrystalline cores for quantum dots based on heterostructures. Although embodiments described herein are not so limited, examples below are directed toward synthesis of alloyed ternary $CdSe_nS_{n-1}$ nanocrystals.

To provide context, a seeded semiconductor quantum rod architecture may be employed to optimize quantum dot absorption and photoluminescence characteristics for the purposes of downconverting blue light, particularly for solid-state lighting applications. The architecture utilizes a Type I electronic structure created by the combination of the semiconductor seed material as the core and semiconductor rod material as the shell, resulting in an absorption that is dominated by the rod material. Furthermore, the result is an emission peak which is dictated by the seed material and size/shape, but which is also affected by the diameter and length of the rod. An example of such an architecture which emits between 600 and 620 nm is a seed which is approximately 4 nanometers in diameter (minor axis) coated with at least one other material which results in an overall particle that is rod shaped, approximately 6-7 nanometers in diameter, and approximately 20-25 nanometers in length.

To provide further context, emitters such as those described above may be optimized to exhibit very high photoluminescence at both room temperature and high temperature in a matrix. Additionally, very reliable performance may be achieved under a variety of stress conditions. In order to shift the emission peak of this exemplary particle to a higher energy, for example between 500 and 560 nanometers or even higher (e.g., less than approximately 500 nanometers), using the same seeded rod architecture, the seed size must become smaller. In accordance with one or more embodiments, experiments have been carried out with seeds as small as 2 nanometers (minor axis). However, after coating with a material to form a rod in accordance with an established baseline process as well as modifications of that process, the centroid emission peak is consistently at least 560 nm or higher, as shown in FIG. 13.

Figure 13:
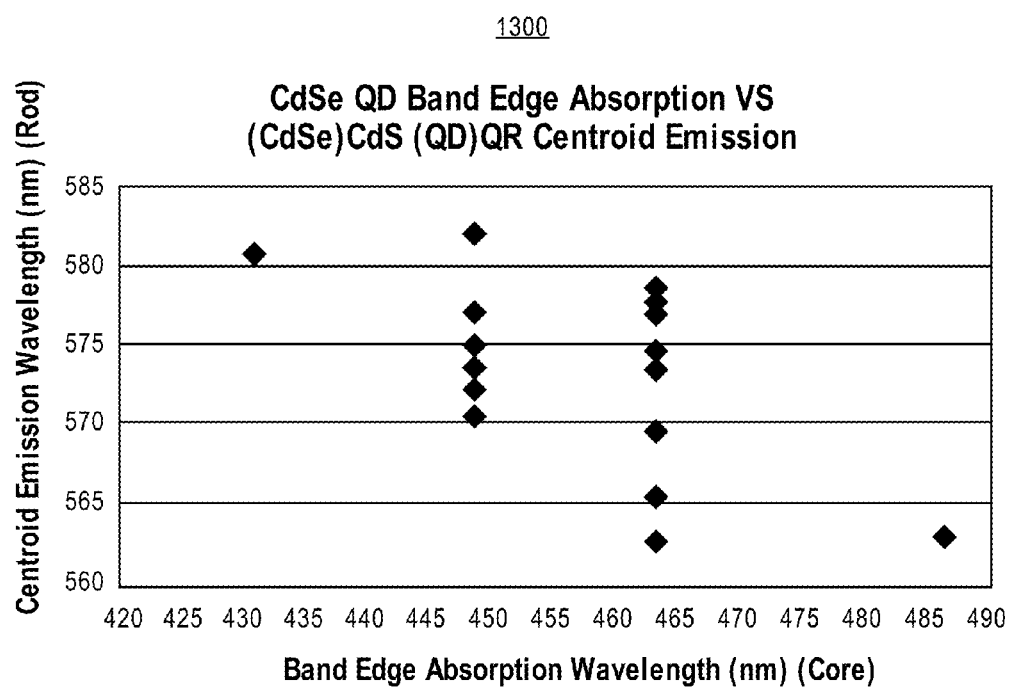
FIG. 13 is a plot of CdSe QD band edge absorption versus (CdSe)CdS (QD)QR centroid emission, in accordance with an embodiment of the invention.

FIG. 13 is a plot 1300 of CdSe seed QD band edge absorption versus (CdSe)CdS (QD)QR centroid emission, in accordance with an embodiment of the invention. Referring to plot 1300, band edge absorption of pure CdSe seeds shows that in cases where the band edge absorption is as low as 430 nanometers, the result is an emission peak at 580 nanometers. Furthermore, regardless of band edge absorption, emission remains consistently above 560 nanometers.

Thus, even though the seed is much smaller than 4 nanometers, the addition of the rod material shifts the emission peak substantially redder than the desired value. In addition, changing the size of the seed means that the overall dimensions of the rod change, sometimes drastically, which in turn means that other subsequent fabrication operations may need to be re-optimized each time the seed size is changed.

Addressing one or more of the above observations, in accordance with one or more embodiments herein, an alternative to altering seed size for tuning the emission of a seeded rod emitter architecture is provided. More particularly, instead of changing seed size, the seed composition is changed by alloying either the entire seed (in one embodiment) or some portion of the seed (in another embodiment) with a higher bandgap material. In either case, the general approach can be referred to as an alloying of the seed or nanocrystalline core portion of a heterostructure quantum dot. By alloying the seed or nanocrystalline core, the bandgap can be changed without changing the size of the seed or core. As such, the emission of the seed or core can be changed without changing the size of the seed or core. In one such embodiment, the size of the seed is fixed at the optimum size of a red-emitting seed, or roughly 4 nanometers. The fixed sized means that the size of the rod and the subsequent synthetic operations may not need to be substantially re-optimized or altered as the emission target of the quantum dots is changed. The concept is described in association with FIGS. 14A and 14B.

Figure 14A:
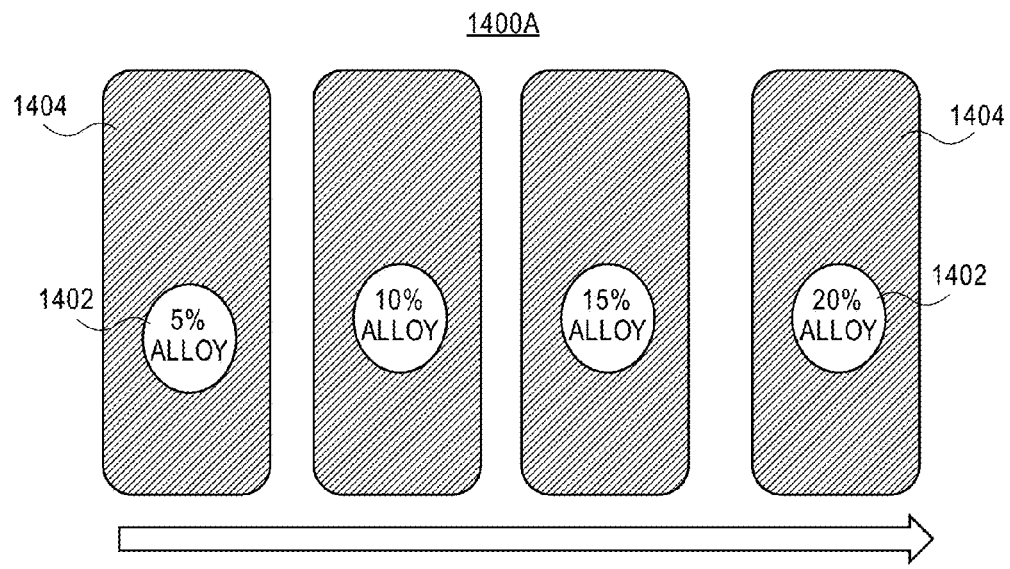
FIG. 14A is a schematic illustrating emission wavelength (nm) decrease as a function of energy increase, in accordance with an embodiment of the invention.

FIG. 14A is a schematic 1400A illustrating emission wavelength (nm) decrease as a function of energy increase, in accordance with an embodiment of the invention. The schematic 1400A shows a same size seed or nanocrystalline core 1402 within a rod or nanocrystalline shell 1404, neither of which changes size. Instead, emission shifts (e.g., wavelength decrease, energy increase) as the extent of seed 1402 alloying is modified along the arrow shown in FIG. 14A. In one such embodiment, the % of alloy represents an amount of a secondary seed material makes up the total core material.

Figure 14B:
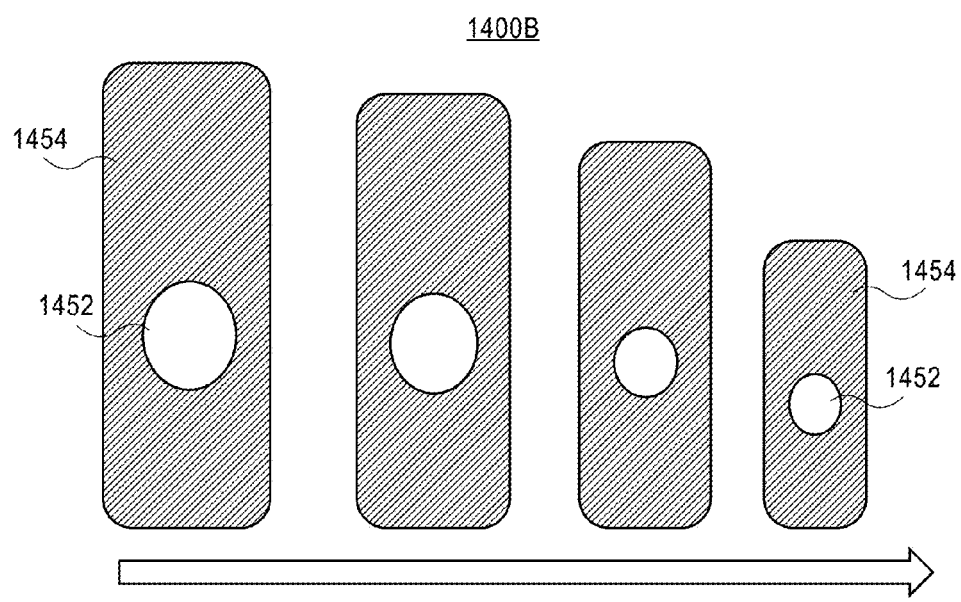
FIG. 14B is a schematic illustrating emission wavelength (nm) decrease as a function of energy increase, in accordance with another embodiment of the invention.

For comparison, FIG. 14B is a schematic 1400B illustrating emission wavelength (nm) decrease as a function of energy increase, in accordance with another embodiment of the invention. The schematic 1400B shows a seed or nanocrystalline core 1452 that is reduced in size within a rod or nanocrystalline shell 1454 that is also reduced in size. Emission shifts (e.g., wavelength decrease, energy increase) as the extent of seed size is reduced along the arrow shown in FIG. 14B. The composition of the seed or core 1452, however, is not changed in this case.

Accordingly, in one or more embodiments described herein, optimum physical dimensions of a seeded rod are maintained as constant while tuning the emission peak of the heterostructure quantum dot. This can be performed without changing the dimensions of the seed (and therefore the rod) for each emission color. In a particular embodiment, a quantum dot includes an alloyed Group II-VI nanocrystalline core. The quantum dot also includes a Group II-VI nanocrystalline shell composed of a semiconductor material composition different from the alloyed Group II-VI nanocrystalline core. The Group II-VI nanocrystalline shell is bonded to and completely surrounds the alloyed Group II-VI nanocrystalline core. In one such embodiment, the alloyed Group II-VI nanocrystalline core is composed of $CdSe_nS_{1-n}$ (0<n<1), and the Group II-VI nanocrystalline shell is composed of CdS. In a specific embodiment, the alloyed Group II-VI nanocrystalline core has a shortest diameter of greater than approximately 2 nanometers, and the quantum dot has an exciton peak less than 555 nanometers. In a particular embodiment, the alloyed Group II-VI nanocrystalline core has a shortest diameter of approximately 4 nanometers, and the quantum dot has an exciton peak less than 555 nanometers, as is described in greater detail below Perhaps more generally, in an embodiment, a quantum dot includes a ternary semiconductor nanocrystalline core. The quantum dot also includes a binary semiconductor nanocrystalline shell including two of three elements of the ternary semiconductor nanocrystalline core. The binary semiconductor nanocrystalline shell is bonded to and completely surrounds the ternary semiconductor nanocrystalline core. In one such embodiment, the ternary semiconductor nanocrystalline core is composed of a first Group II-VI material, and the binary semiconductor nanocrystalline shell is composed of a second, different, Group II-VI material. In one such embodiment, the first Group II-VI material is $CdSe_nS_{1-n}$ (0<n<1), and the second Group II-VI material is CdS.

The terms "binary" and "ternary" as used herein refer to compound semiconductor materials composed of two or three elements, respectively. For example, CdS is a binary semiconductor material since it is composed of Cd and S. On the other hand, $CdSe_nS_{1-n}$ (0<n<1) is a ternary semiconductor material since it is composed of Cd, Se and S. In the case that the binary semiconductor nanocrystalline shell includes two of the three elements of the ternary semiconductor nanocrystalline core, in an exemplary embodiment, a CdS binary semiconductor nanocrystalline shell includes Cd and S which are also included in a $CdSe_nS_{1-n}$ (0<n<1) ternary semiconductor nanocrystalline core.

Regarding actual synthesis of such alloyed seeds or cores, or heterostructures having such seeds or cores therein, Example 17, provided below under Exemplary Synthetic Procedures, outlines an exemplary synthesis of ternary $CdSe_nS_{n-1}$ QD seeds, in accordance with an embodiment of the invention. Example 18, provided below under Exemplary Synthetic Procedures, outlines an exemplary synthesis of high quality ternary $CdSe_nS_{n-1}$ QD seeds for use in high performance nano-sized, semiconducting heterostructures, in accordance with an embodiment of the invention. Example 19, provided below under Exemplary Synthetic Procedures, outlines an exemplary synthesis of high quality ternary $CdSe_nS_{n-1}$ QD seeds for use in high performance nano-sized, semiconducting heterostructures where the synthesis involves the use of sulfur in allylamine, in accordance with an embodiment of the invention. Example 20, provided below under Exemplary Synthetic Procedures, outlines an exemplary synthesis of high quality ternary $CdSe_nS_{n-1}$ QD seeds for use in high performance nano-sized, semiconducting heterostructures where the synthesis involves the use of sulfur in octadecene, in accordance with an embodiment of the invention.

Figure 15:
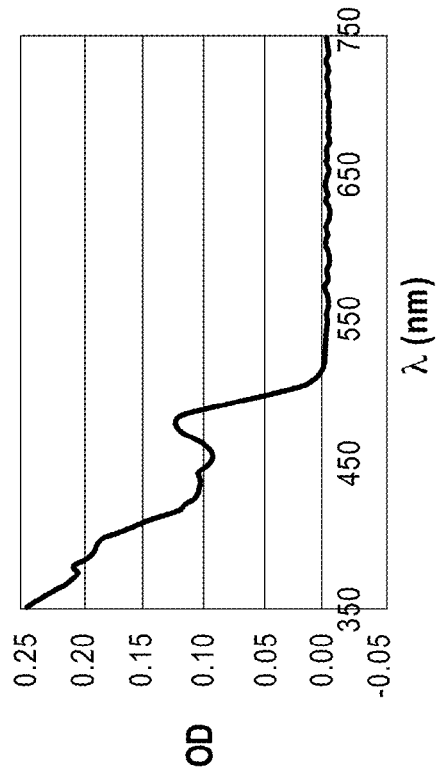
FIG. 15 includes a UV-Vis spectrum of CdSeS QDs with $\lambda_{max}$ at approximately 464.7 nm and a UV-Vis spectrum of CdSeS QDs with $\lambda_{max}$ at approximately 476.2 nm, in accordance with an embodiment of the present invention.
Figure 15:
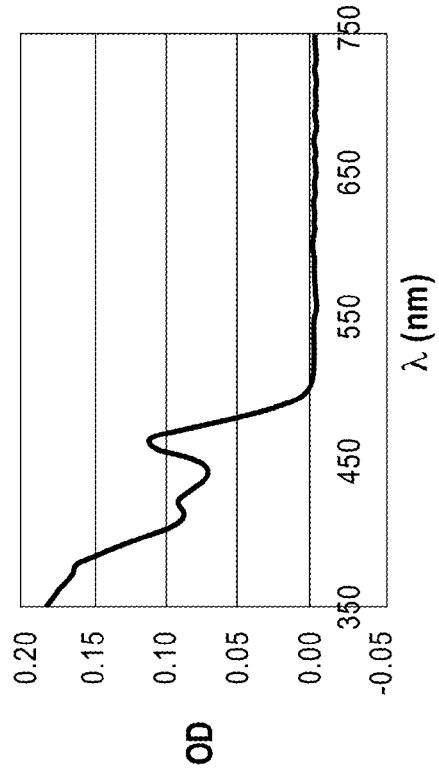

In one aspect, so-called blue alloyed cores may be fabricated. FIG. 15 includes a UV-Vis spectrum 1500 of CdSeS QDs with $\lambda_{max}$ at approximately 464.7 nm and a UV-Vis spectrum 1502 of CdSeS QDs with $\lambda_{max}$ at approximately 476.2 nm, in accordance with an embodiment of the invention. Referring to FIG. 15, the blue alloyed cores were synthesized according to the procedure of Example 17.

Figure 16:
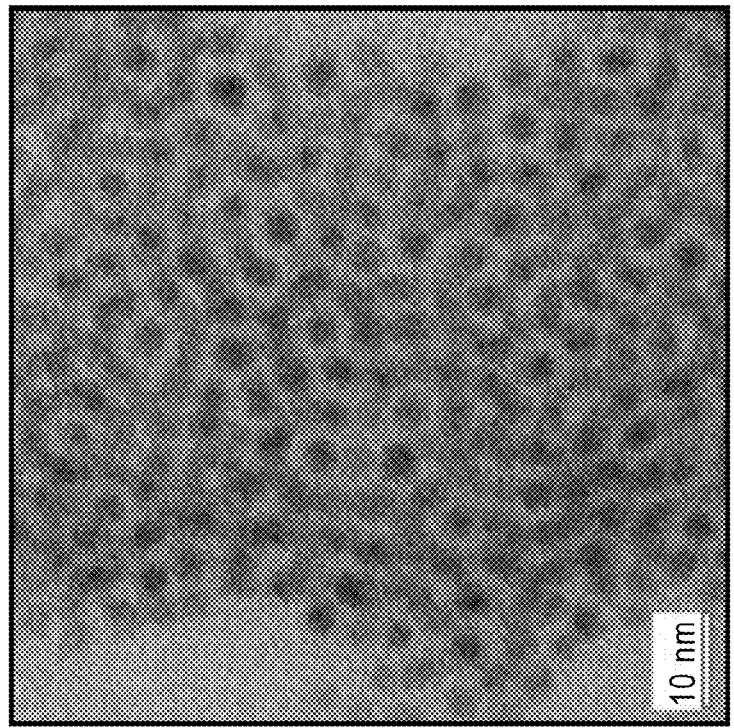
FIG. 16 includes a transmission electron microscope (TEM) image and a TEM image comparing CdSe QDs and CdSeS QDs, respectively, in accordance with an embodiment of the present invention.
Figure 16:
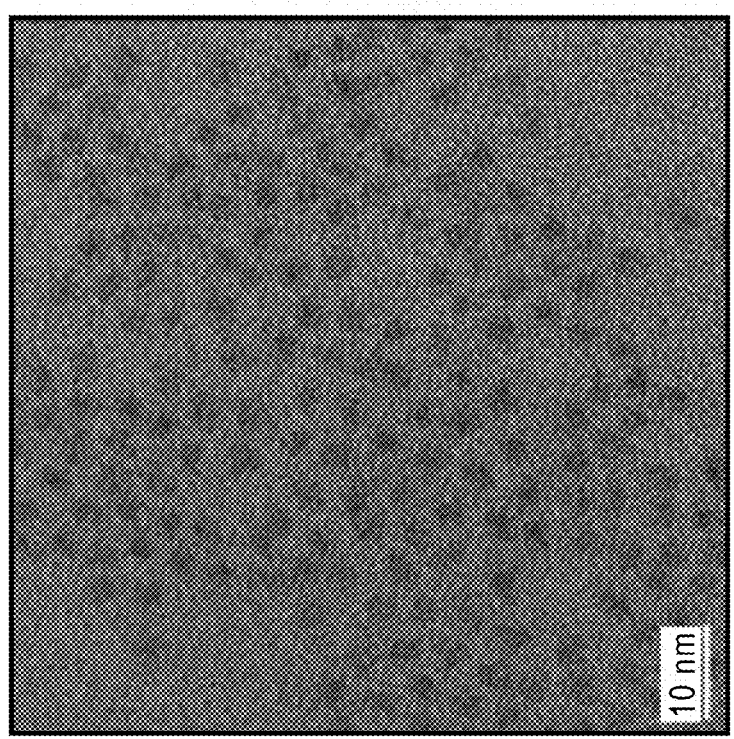

FIG. 16 includes a transmission electron microscope (TEM) image 1600 and a TEM image 1602 comparing CdSe QDs and CdSeS QDs, respectively, in accordance with an embodiment of the invention. Referring to FIG. 16, with the same exciton peak, the CdSeS QDs are clearly larger. That is, the exciton peak should otherwise be redder than 465 nanometers without the presence of the Sulfur component.

Figure 17:
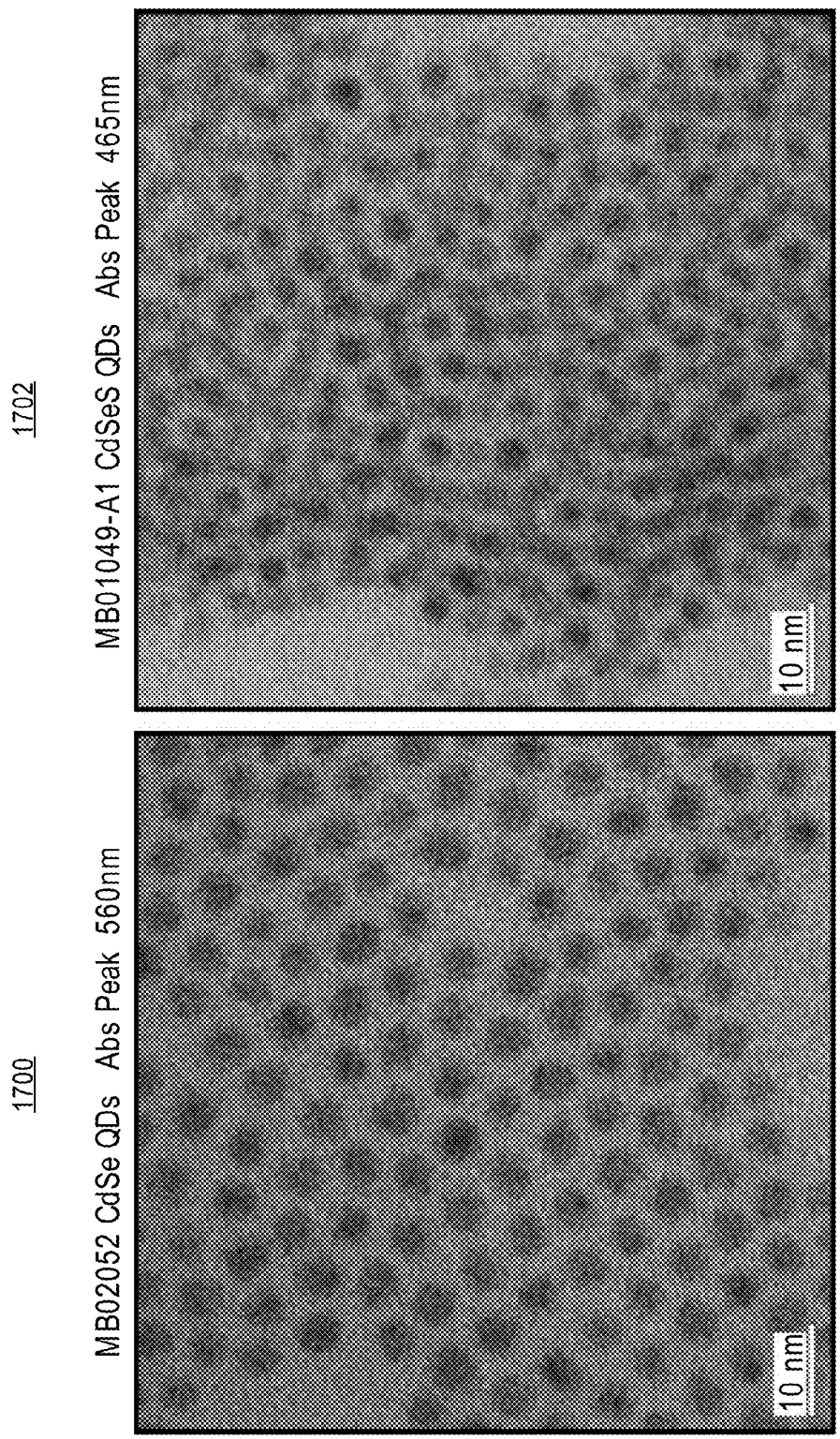
FIG. 17 includes a TEM image and a TEM image comparing CdSe QDs and CdSeS QDs, respectively, in accordance with another embodiment of the present invention.

FIG. 17 includes a TEM image 1700 and a TEM image 1702 comparing CdSe QDs and CdSeS QDs, respectively, in accordance with another embodiment of the invention. Referring to FIG. 17, the TEM comparison shows CdSe seeds with an exciton peak around 560 nanometers as compared with CdSeS seeds having an exciton peak at 465 nanometers.

Figure 18:
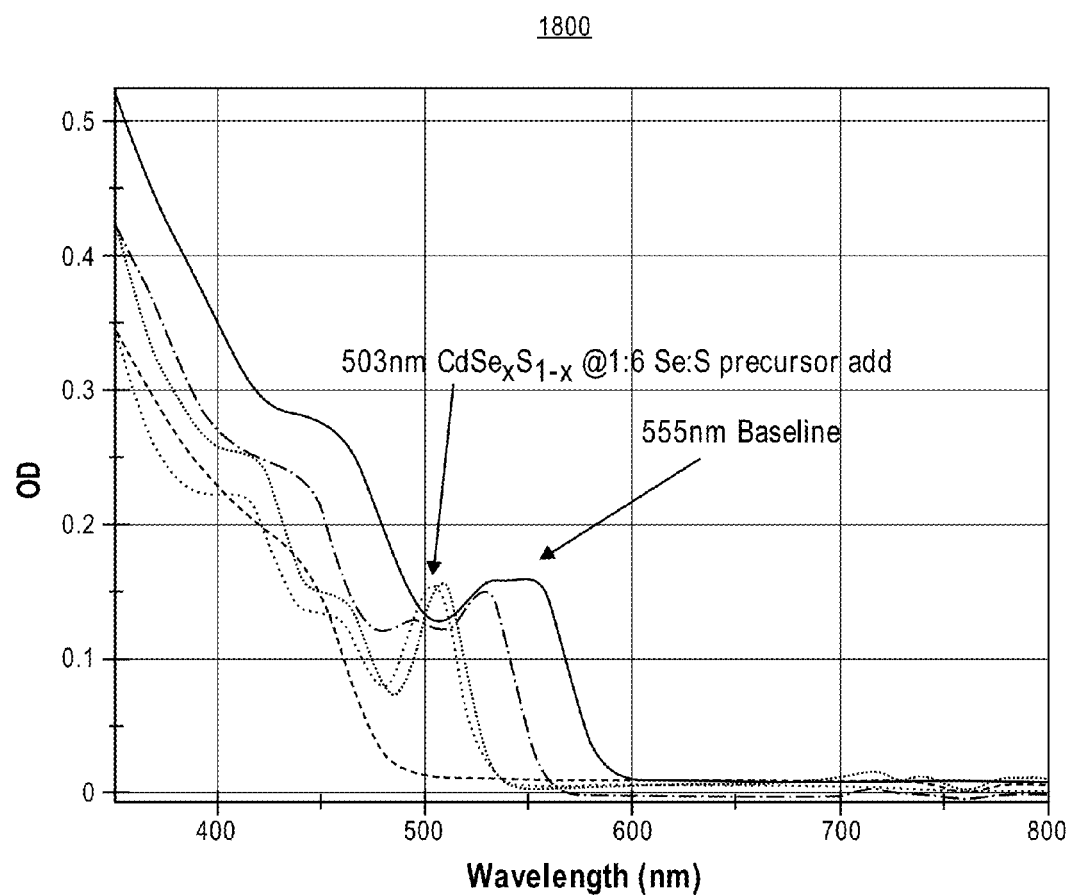
FIG. 18 is a plot showing transmission spectroscopy curves for alloyed nanocrystals, in accordance with an embodiment of the present invention.

FIG. 18 is a plot 1800 showing transmission spectroscopy curves for alloyed nanocrystals, in accordance with an embodiment of the invention. Referring to FIG. 18, the 4.2 nanometer CdSeS cores have a 510 nm 1st exciton peak. By comparison, a typical 4.2 nanometer CdSe has an exciton peak around 555 nm. In one embodiment, then, an alloyed Group II-VI nanocrystalline core has a shortest diameter of greater than approximately 2 nanometers, and the resulting quantum dot has an exciton peak less than 555 nanometers. In a particular embodiment, the alloyed Group II-VI nanocrystalline core has a shortest diameter of approximately 4 nanometers, and the resulting quantum dot has an exciton peak less than 555 nanometers Overall, then, in an embodiment, a method of tuning an exciton peak for a quantum dot involves selecting a composition and a sizing of an alloyed Group II-VI nanocrystalline core corresponding to a targeted exciton peak for the quantum dot. The method also involves forming the alloyed Group II-VI nanocrystalline core having the composition and the particular sizing. The method also involves forming a Group II-VI nanocrystalline shell having a semiconductor material composition different from the alloyed Group II-VI nanocrystalline core, the Group II-VI nanocrystalline shell bonded to and completely surrounding the alloyed Group II-VI nanocrystalline core.

It is to be appreciated that other aspects of quantum dot formation (e.g., insulator coating formation) and quantum dot application (e.g., LED application) can be applied to the above described alloyed seed/nanocrystalline cores.

As previously discussed herein, a seeded semiconductor quantum rod architecture may be employed to optimize quantum dot absorption and photoluminescence characteristics for the purposes of downconverting blue light, particularly for solid-state lighting applications. The architecture utilizes a Type I electronic structure created by the combination of the semiconductor seed material and semiconductor rod material, resulting in an absorption which is dominated by the rod material. Furthermore, the result is an emission peak which is dictated by the seed material and size/shape, but which is also affected by the diameter and length of the rod.

Figure 19:
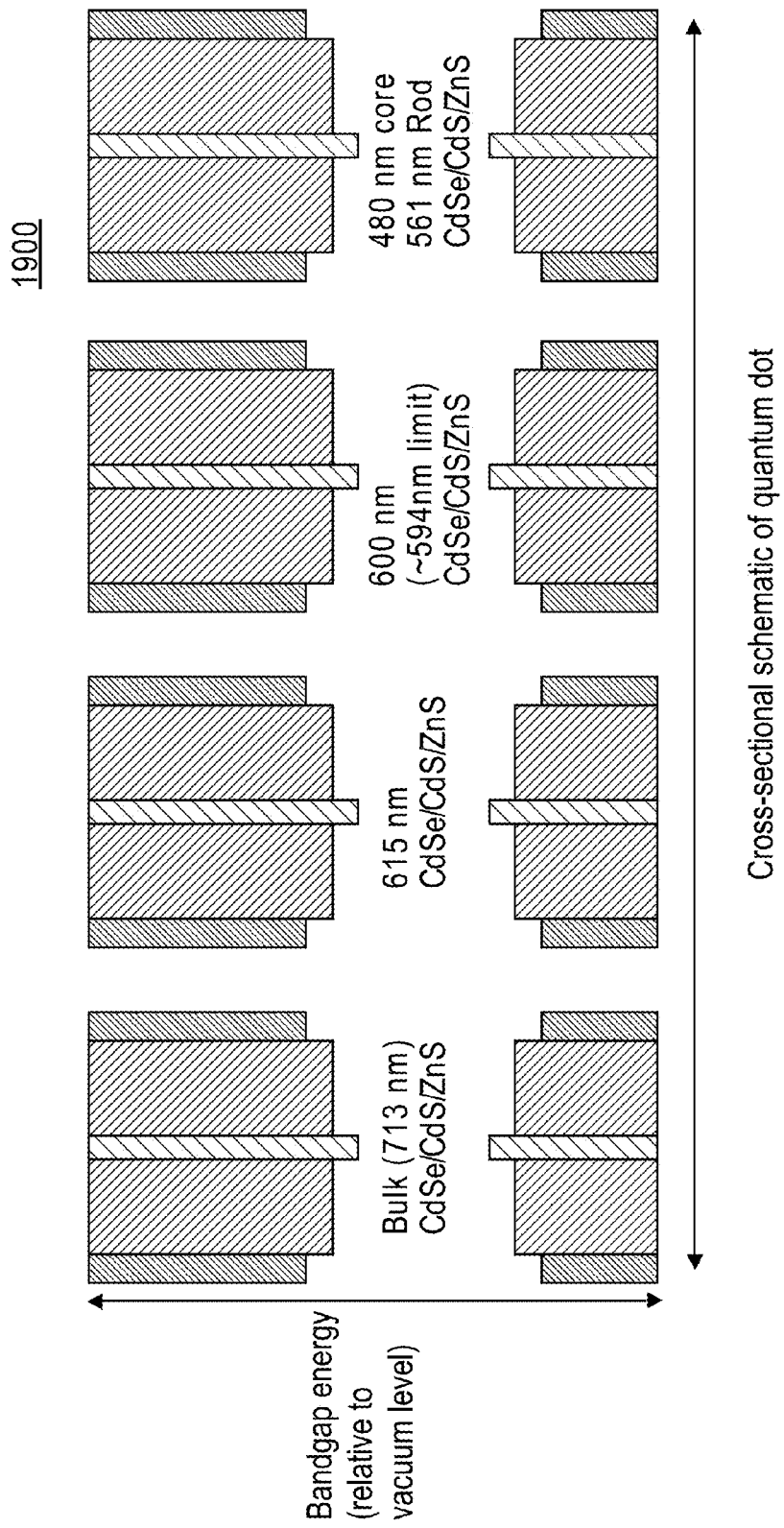
FIG. 19 illustrates a Type I heterostructure using binary semiconductors for a nanocrystalline core, a nanocrystalline shell, and a nanocrystalline outer shell, in which transition to Type II heterostructure occurs around 594 nm.

In one embodiment, materials used to create the rod-shaped shell portion of the quantum dot heterostructure are able to absorb blue light (e.g., 450 nm), while transferring the excited state in the Type I electronic structure to the seed or core, which emits at a lower energy. Because the seed required to emit green light (520 to 570 nm) has a large bandgap, the bandgap can potentially be close to that of CdS, which, as discussed above, is a binary semiconductor nanocrystalline material typically used to grow a Group II-VI rod. For example, FIG. 19 depicts various quantum dot structures 1900 using a binary semiconductor nanocrystalline core and a binary semiconductor nanocrystalline shell bonded to and surrounding the binary semiconductor nanocrystalline core. The binary semiconductor nanocrystalline core is composed of a first Group II-VI material, and the binary semiconductor nanocrystalline shell is composed of a second, different, Group II-VI material. In one such embodiment, the first Group II-VI material is $CdSe_nS_{1-n}$ (0<n<1), and the second Group II-VI material is CdS. The semiconductor structure further includes a nanocrystalline outer shell at least partially surrounding the nanocrystalline shell and, in one embodiment, the nanocrystalline outer shell completely surrounds the nanocrystalline shell. The nanocrystalline outer shell is composed of a third semiconductor material different from the semiconductor material of the shell and different from the semiconductor material of the core. In one such embodiment, the material is ZnS. In a particular such embodiment, the first semiconductor material is cadmium selenide (CdSe) or cadmium selenide sulfide (CDSeS), the second semiconductor material is cadmium zinc sulfide (CdZnS), and the third semiconductor material is zinc sulfide (ZnS). Using binary semiconductor materials, the transition between Type I and Type II electronic heterostructure overlap occurs around 594 nm (using bulk bandgaps for the shell layers).

In contrast to a CdS rod, a ZnS rod exhibits a large degree of Type I heterostructure confinement, but ZnS does not absorb blue light (450 nm). Therefore, one embodiment of the invention incorporates Zn into a CdS rod to adjust the bandgap sufficiently to confine the seed without decreasing the absorbance at 450 nm. In one embodiment, the amount of Zn incorporated in a CdS rod is approximate 20%. FIG.

20 depicts various quantum dot structures 2000, according to embodiments of the invention, that use a ternary semiconductor nanocrystalline core and a ternary semiconductor nanocrystalline shell bonded to and surrounding the ternary semiconductor nanocrystalline core. The ternary semiconductor nanocrystalline core is composed of a first Group II-VI material, and the ternary semiconductor nanocrystalline shell is composed of a second, different, Group II-VI material. In one such embodiment, the first Group II-VI material is $CdSe_nS_{1-n}$ (0<n<1), and the second Group II-VI material is CdZnS. The semiconductor structure further includes a nanocrystalline outer shell at least partially surrounding the nanocrystalline shell. The nanocrystalline outer shell is composed of a third semiconductor material different from the semiconductor material of the shell and different from the semiconductor material of the core. In one such embodiment, the material is ZnS. Using ternary semiconductor materials, the transition between Type I and Type II heterostructure overlap is delayed until approximately 490 nm (using bulk bandgap for the outer shell layer).

Figure 21:
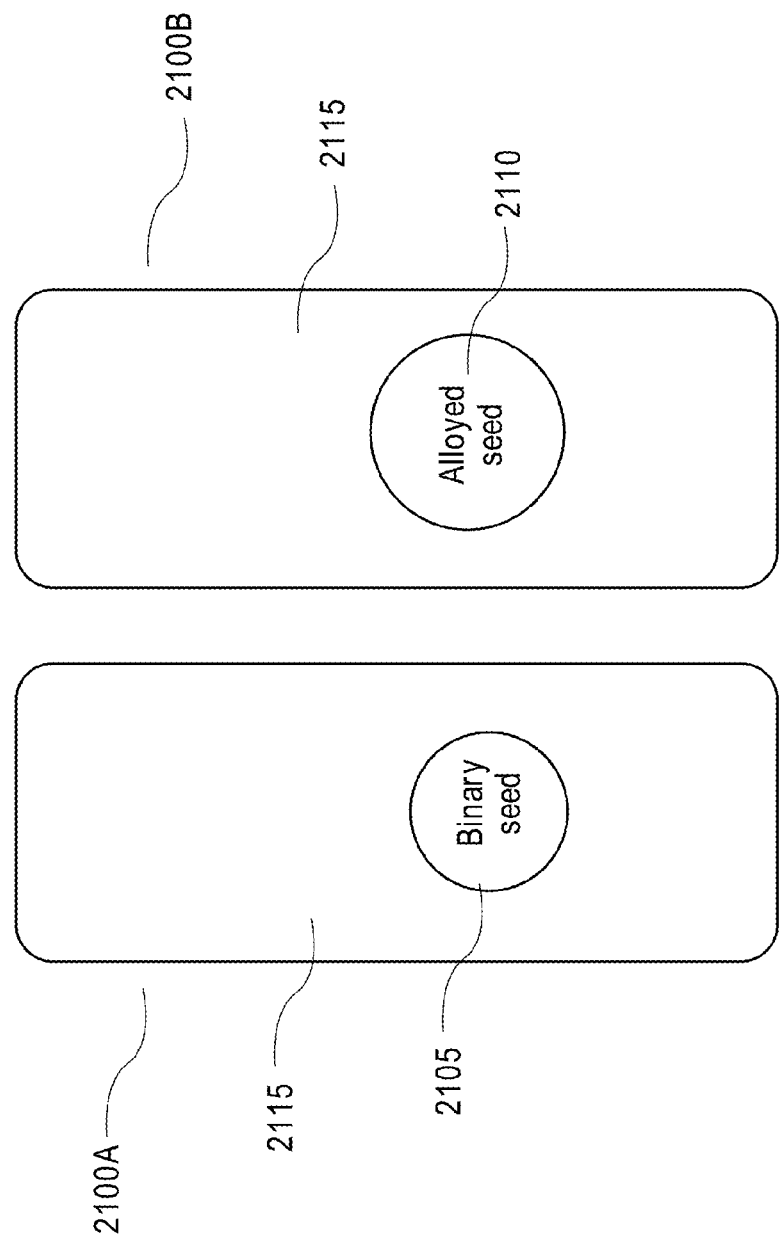
FIG. 21 illustrates a ternary semiconductor nanocrystalline shell surrounding a binary or ternary semiconductor nanocrystalline core in accordance with an embodiment of the present invention.

With reference to FIG. 21, embodiments of the invention provide for a very stable, high performance doped/alloyed semiconductor nanorod structure 2100A, 2100B, composed of a quantum dot seed, and a ternary semiconductor nanocrystalline shell 2115 (e.g., CdZnS, or CdMgS). In one embodiment 2100A, the seed is a binary semiconductor nanocrystalline core 2105 (e.g., CdSe). In another embodiment 2100B, the seed is an alloyed, ternary semiconductor nanocrystalline core 2110 (e.g., CdSeS). According to one embodiment, the seeds must have a very small diameter and/or exhibit a high energy first exciton peak, usually greater (bluer) than 460 nm. In both embodiments, the resulting structures exhibit high PLQY emission at <550 nm. In contrast, a quantum dot with a binary semiconductor nanocrystalline core and a binary semiconductor nanocrystalline shell may yield emission at <550 nm but only with a much smaller particle, which is less stable and has a lower PLQY.

In one embodiment, the seeded rods 2100A, 2100B have a ternary semiconductor nanocrystalline shell with a short axis having a length in the range of 5-8 nanometers, and a long axis having a length approximately in the range of 16-30 nanometers.

Figure 20:
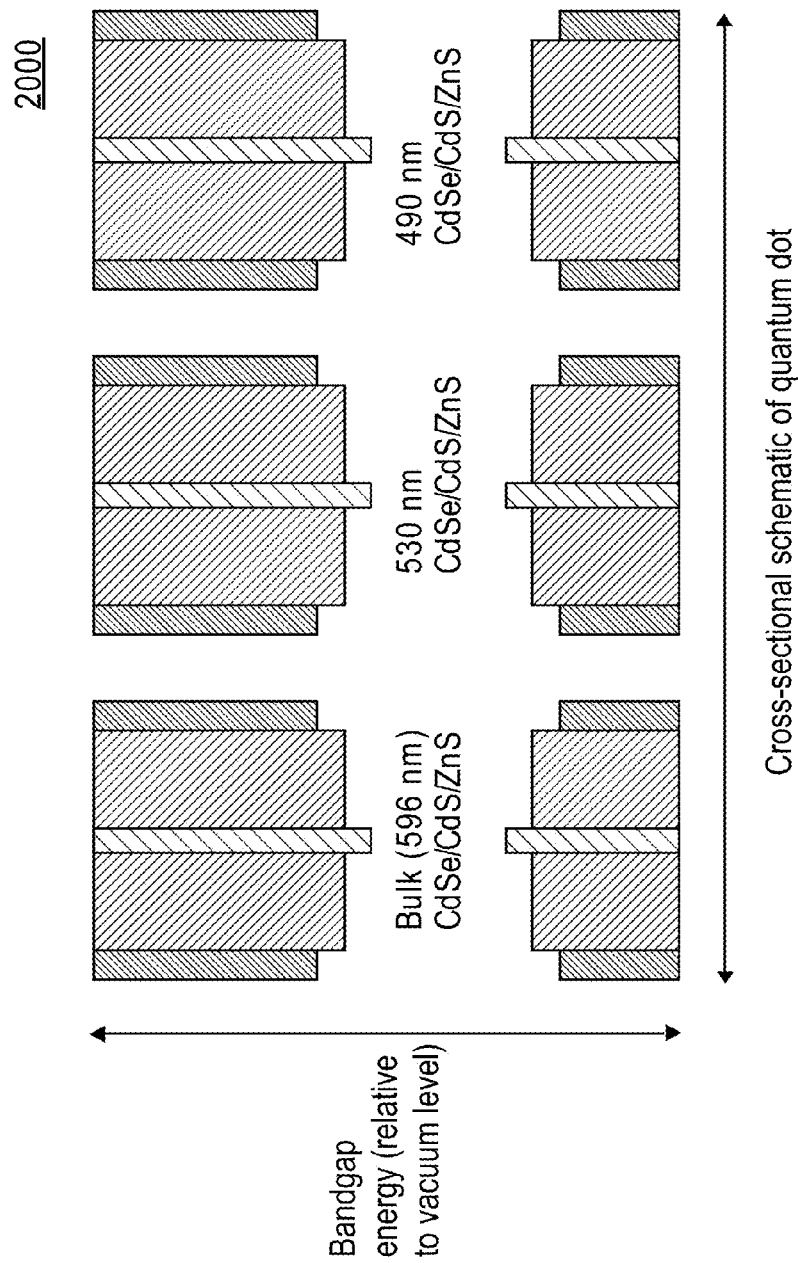
FIG. 20 illustrates a Type I heterostructure using ternary semiconductors for a nanocrystalline core and nanocrystalline shell, in which transition to a Type II heterostructure occurs around 490 nm.
Figure 22:
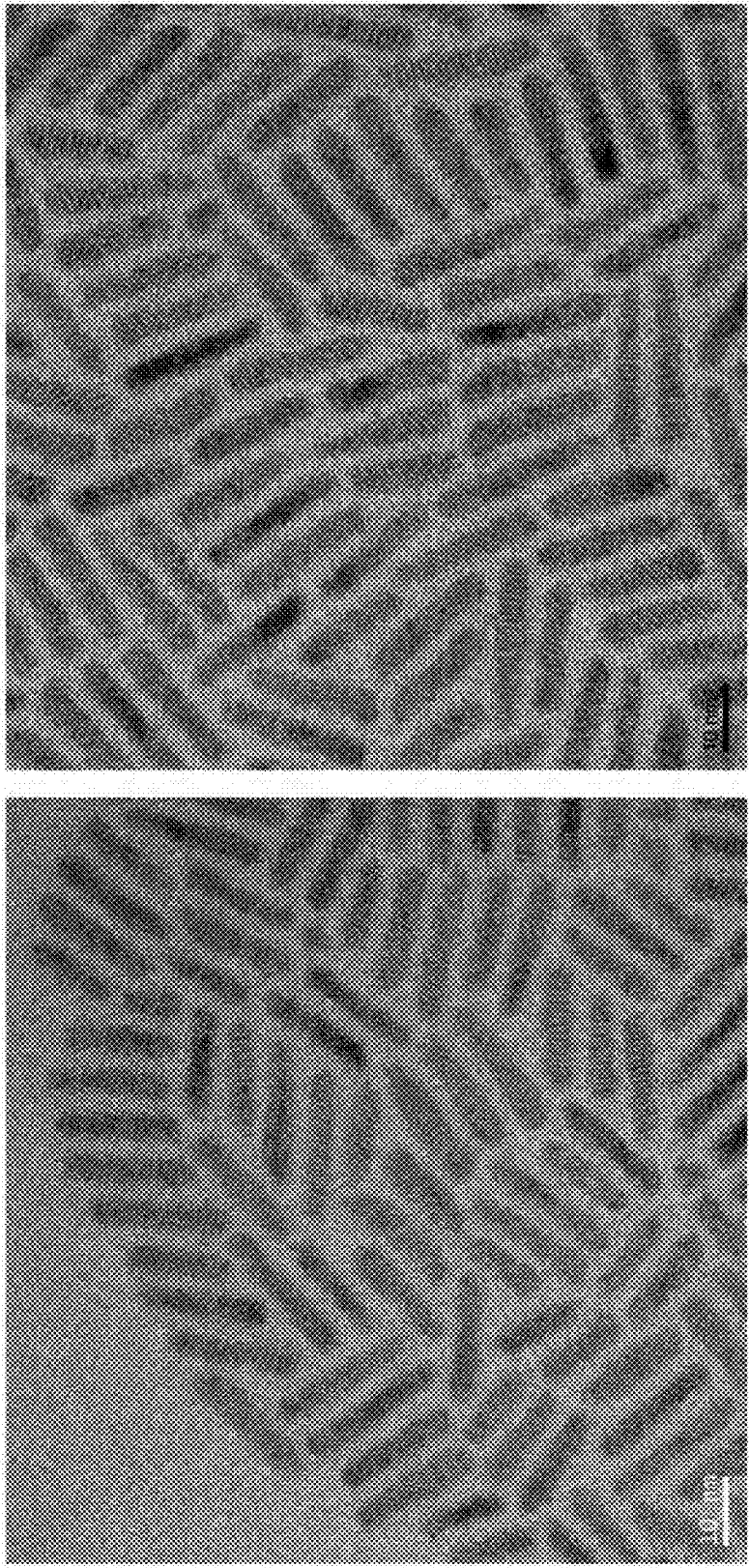
FIG. 22 includes TEM images comparing a ternary CdZnS shell on a binary CdSe core to a ternary CdZnS shell on a ternary CdSeS core, according to embodiments of the present invention.

FIG. 22 includes a transmission electron microscope (TEM) image 2200 and a TEM image 2202, respectively, of a ternary CdZnS shell on a binary CdSe core with total length of 17.1 nm and total width of 4.0 nm, and a ternary CdZnS shell on a ternary CdSeS core with total length of 20.0 nm and total width of 4.2 nm. With the combination of a binary or ternary core and a ternary alloyed CdZnS shell, "green" emission wavelengths in the range of 530-540 nm are achieved, while maintaining high PLQY (up to 99%), and a Type I or quasi-Type II electronic structure, as depicted in FIG. 20. Furthermore, all this is achieved while still maintaining reliable and stable morphology of a seeded rod of standard dimensions of 16-20 nm (average length) by 4-6 nm (average width).

Material analyses of the seeded rods by energy dispersive X-ray analytical system (SEM-EDX) and inductively coupled plasma optical emission spectroscopy (ICP-OES) corroborate alloying of metals into the semiconductor nanocrystalline shell. The advantage of doping/alloying is evident in the ability to tune the wavelength of emission while maintaining high photoluminescence quantum yield with a high degree of robustness.

Figure 23:
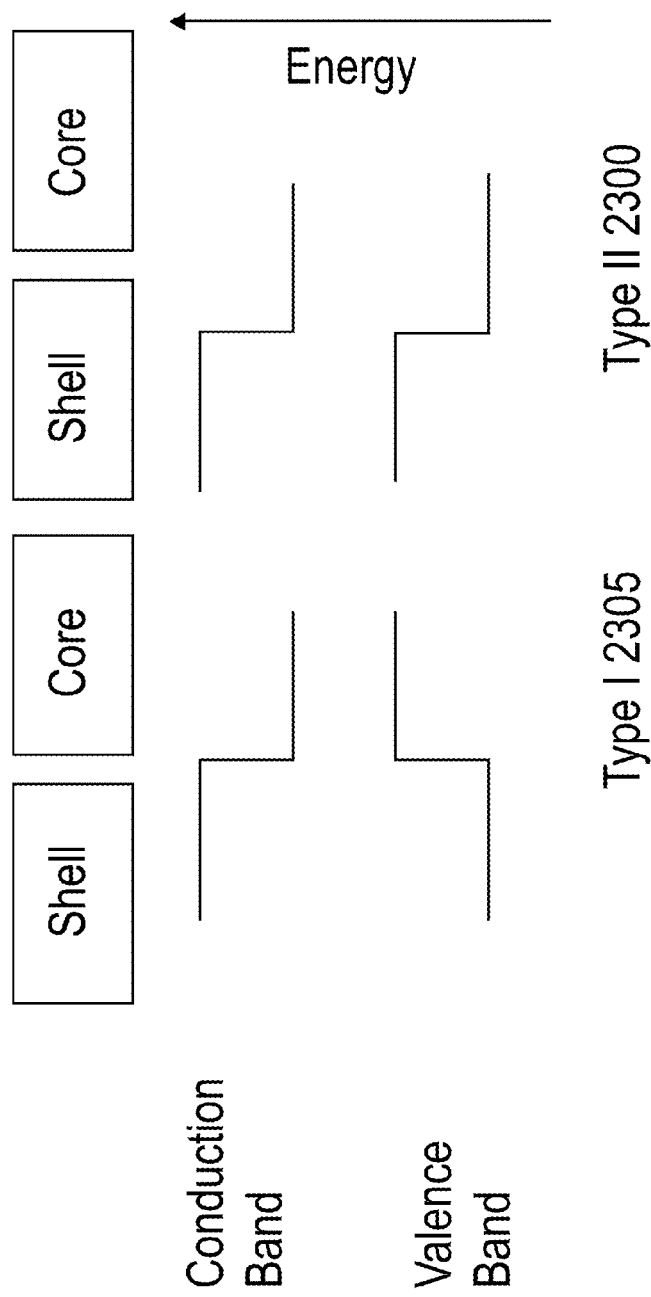
FIG. 23 illustrates a desired Type-I bandgap heterojunction versus an undesired Type-II bandgap heterojunction in connection with an embodiment of the invention.

As previously discussed herein, embodiments of the invention employ a seeded semiconductor quantum rod architecture to optimize quantum dot absorption and photoluminescence characteristics. Such embodiments may be used for purposes of downconverting blue light, particularly for solid-state lighting applications, as described, for example, by the assignee of U.S. patent application Ser. Nos. 13/485,756, 13/485,761, and 13/485,762, the contents of which are incorporated herein by reference. In particular, by using a different core and shell materials, embodiments of the invention create a quantum dot heterostructure material. The semiconductor bandgaps of these materials are important, but also important is the relative alignment of the electronic energy levels of the materials. Specifically, avoiding a Type II bandgap heterojunction (as depicted at 2300 in FIG. 23) is important for realizing high brightness quantum dots. Quantum dot architecture according to embodiments of the invention utilizes a Type I electronic structure created by the combination of the semiconductor seed material as the core and semiconductor rod material as the shell, resulting in an absorption which is dominated, that is, substantially controlled, by the rod material, and an emission peak which is dictated, that is, substantially controlled, by the seed material and size, and also affected by the diameter and length of the rod material. An example of this architecture, which emits between 600 and 620 nm, is a seed that is 4 nm in diameter (minor axis) and coated with at least one other material, which results in an overall particle that is rod shaped, 6-7 nm in diameter, and 20-25 nm in length. This emitter is optimized to exhibit very high photoluminescence at both room temperature and high temperature in a matrix, as well as very reliable performance under a variety of stress conditions.

Materials used to manufacture the rod in a second step and/or for the additional semiconductor barrier coating or outer shell layer in a third step of the architecture make use of successively wider bandgap materials, according to an embodiment. Furthermore, the band alignment of the shell layer and outer shell layer should preferentially promote the localization of the wave function of both the electron and the hole to the core portion where radiative recombination can occur. Additionally, minimal lattice constants mismatch is very desirable to reduce strain during growth between adjacent materials. In the prior art, CdS, ZnSe, and ZnS are commonly used to coat CdSe, and ZnSe and ZnS have been used to coat CdS to create quantum dot heterostructures with Type I or quasi Type II heterojunction bandgap alignments. In embodiments of the invention, however, wide-bandgap magnesium-based semiconductor materials are employed in the second layer (the rod material) and/or third layer (the outer shell) of the quantum dot heterostructure. In one embodiment, a wide bandgap is greater than 2 eV. In particular, magnesium chalcogenides, such as MgO, MgS, and MgSe, are materials with wide bandgaps that have suitable band alignments with minimal lattice constants mismatch for adjacent materials used in the seeded rod quantum dot configuration. In addition to binary magnesium chalcogenides, magnesium can be incorporated and alloyed with other semiconductor materials such as CdS, ZnSe, and ZnS to create ternary semiconductor materials. These ternary alloyed semiconductor materials may be engineered to have a more optimal bandgap, band alignment, and lattice mismatch to realize a structure with a Type I band alignment. Furthermore, such alloying of Mg allows for facile incorporation of novel semiconductor quantum dot architectures into existing synthetic processes. This is particularly useful when designing and maintaining a Type I architecture while using wider bandgap, bluer core materials in the quantum dot structure, such as with small binary CdSe or ternary CdSe$_m$S$_{m-1}$ seed, or core, materials.

Embodiments of the invention allow bandgap engineering via the incorporation of Magnesium in a given quantum dot electronic structure in order to maintain a Type I alignment architecture with higher quantum efficiencies when employing wider bandgap (bluer) core materials. Maintaining blue emission from a quantum dot core while employing a thick semiconductor shell (used for minimizing self-absorption and protection from degradation) can be a challenge because the bandgap of the core is influenced by the thickness of the shell. By making an appropriate alloy of CdZnS, both of the desirable properties of Type I bandgap alignment and a highly absorbing shell layer can be maintained. However, in order to add a third layer, an outer shell, which is protective but not necessarily absorbing, the embodiments described herein use an alloy of Zn$_m$Mg$_{m-1}$S. Similarly, instead of a CdZnS alloy for the seed or first shell layer, a Cd$_n$Mg$_{n-1}$S alloy can be employed in other embodiments. The addition of Mg in the right ratios allows for the careful tuning of the bandgap properties required for optimal performance. In one embodiment, the ratio of Mg to Zn depends on the bandgap of the seed or shell layer that it is being covered. The bluer the core or core/shell combination, the more Mg needs to be used relative to Zn to maintain good Type I bandgap nesting.

Figure 24:
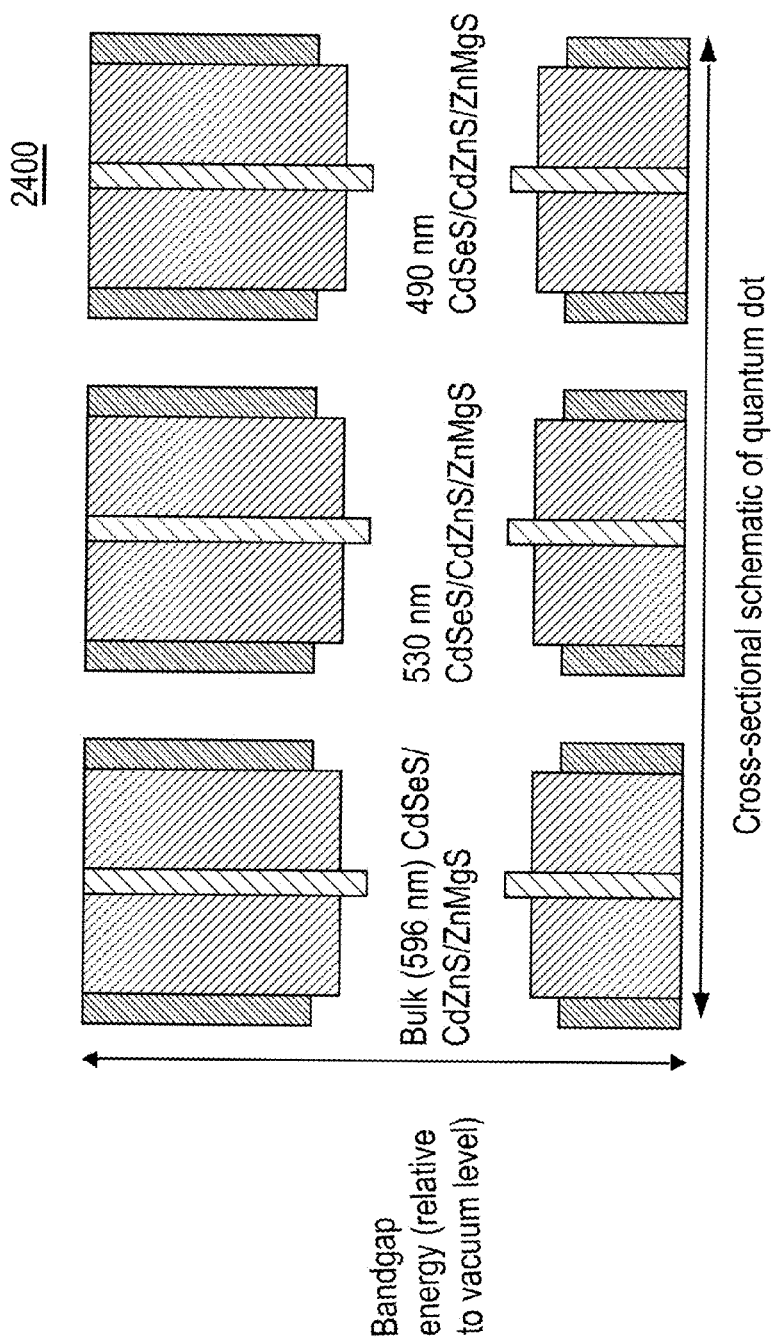
FIG. 24 illustrates a ternary semiconductor nanocrystalline shell surrounding a binary or ternary semiconductor nanocrystalline core in accordance with an embodiment of the invention.

As previously noted, in contrast to a CdS rod, a ZnS rod exhibits a large degree of Type I heterostructure confinement, but ZnS does not absorb blue light (450 nm). Therefore, one embodiment of the invention incorporates Zn into a CdS rod to adjust the bandgap sufficiently to confine the seed without decreasing the absorbance at 450 nm. In one embodiment, the amount of Zn incorporated in a CdS rod is approximately 20%. FIG. 24 depicts various quantum dot structures 2400, according to embodiments of the invention, which use a ternary semiconductor nanocrystalline core and a ternary semiconductor nanocrystalline shell bonded to and surrounding the ternary semiconductor nanocrystalline core. The ternary semiconductor nanocrystalline core is composed of a first Group II-VI material, and the ternary semiconductor nanocrystalline shell is composed of a second, different, Group II-VI material. In one such embodiment, the first Group II-VI material is CdSe$_m$S$_{m-1}$, and the second Group II-VI material is CdZnS. The semiconductor structure further includes a nanocrystalline outer shell at least partially surrounding the nanocrystalline shell. The nanocrystalline outer shell is composed of a third semiconductor material different from the semiconductor material of the shell and different from the semiconductor material of the core. In one such embodiment, the material is ZnMgS. Using ternary semiconductor materials, the transition between Type I and Type II heterostructure overlap is delayed until approximately 490 nm (using bulk bandgap for the outer shell layer).

An exemplary synthesis of (CdSe$_m$S$_{m-1}$)Cd$_n$Mg$_{n-1}$S quantum dots (seed)rod follows. Trioctylphosphine oxide (TOPO), octadecylphosphonic acid (ODPA), hexylphosphonic acid (HPA), cadmium oxide (CdO), and magnesium(II) acetylacetonate (Mg(acac)$_2$) are added into a three-neck roundbottom flask with a thermocouple probe, air condenser, and rubber septum. Under argon flow, the mixture is stirred and heated to 120° C. The vessel is evacuated and the mixture degassed for 75 minutes, followed by purging with argon gas. The temperature is increased to 280° C. and then held for 70 minutes in order to dissociate CdO and Mg(acac)$_2$. The temperature is increased to 320° C., after which trioctylphosphine (TOP) is injected via syringe. The reaction solvent temperature is set to and equilibrated at 280° C. The temperature is then set to 260° C., after which trioctylphosphine sulfide (Trioctylphosphine-sulfide (TOPS), ~7.4% wt. sulfur) and the CdSe$_m$S$_{m-1}$ seeds are rapidly injected at 280° C. The temperature set point is maintained at 260° C. for 90 minutes, and then the heating mantle and glass wool are removed and the reaction vessel is cooled down by flowing compressed air on the outside of the glass while stirring. The resulting reaction product is processed by standard procedures common in the field. Alternatively, magnesium ethoxide, magnesium thiolate, organometallic magnesium precursors such as dibutyl magnesium, and/or other appropriate magnesium precursors may be employed in this procedure by adding via syringe under argon in the beginning of the process or at a slower rate via syringe pump immediately after injection of TOPS.

In accordance with an embodiment of the invention, binary or ternary core/ternary shell quantum dots may be coated with silica and other ligands to provide a structure having a high PLQY. One embodiment exploits a sol-gel process which encapsulates each quantum dot individually in a silica shell, resulting in a very stable high PLQY quantum dot particle. The coated quantum dots disclosed herein may advantageously possess a narrow size distribution for CdSe core stability over time (assessed by PLQY and scattering in solution).

In a general embodiment, a semiconductor structure includes a nanocrystalline core composed of a first semiconductor material. The semiconductor structure also includes an alloyed nanocrystalline shell composed of a second, different, semiconductor material at least partially surrounding the nanocrystalline core. An insulator layer encapsulates, e.g., coats, the alloyed nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the alloyed nanocrystalline shell. In an embodiment, the nanocrystalline core and the alloyed nanocrystalline shell form a quantum dot.

With reference to the above described coated nanocrystalline core and alloyed nanocrystalline shell pairings, in an embodiment, the insulator layer is bonded directly to the alloyed nanocrystalline shell. In one such embodiment, the insulator layer passivates an outermost surface of the alloyed nanocrystalline shell. In another embodiment, the insulator layer provides a barrier for the alloyed nanocrystalline shell and nanocrystalline core impermeable to an environment outside of the insulator layer. In any case, the insulator layer may encapsulate only a single nanocrystalline shell/nanocrystalline core pairing. In an embodiment, the semiconductor structure further includes a nanocrystalline outer shell at least partially surrounding the alloyed nanocrystalline shell, between the alloyed nanocrystalline shell and the insulator layer. The nanocrystalline outer shell is composed of a third semiconductor material different from the alloyed semiconductor material of the shell and, possibly, different from the semiconductor material of the core.

With reference again to the above described coated nanocrystalline core and alloyed nanocrystalline shell pairings, in an embodiment, the insulator layer is composed of a layer of material such as, but not limited to, silica (SiO$_x$), titanium oxide (TiO$_x$), zirconium oxide (ZrO$_x$), alumina (AlO$_x$), or hafnia (HfO$_x$). In one such embodiment, the layer is a layer of silica having a thickness approximately in the range of 3-100 nanometers. In an embodiment, the insulator layer is an amorphous layer.

Thus, according to an embodiment of the invention, by alloying a binary semiconductor nanocrystalline shell (e.g., a CdS rod) with Zn to shift the bandgap "bluer" (e.g., greater than 460 nm), a type-II heterostructure system is avoided while providing protection to the core. Furthermore, this ternary semiconductor nanocrystalline shell configuration minimizes self-absorption by maintaining shell absorption at blue wavelengths typically used for down-shifting LED excitation. Such embodiments may also be used to create green downshifters which exhibit both high PLQY and high reliability.

An exemplary synthesis of such alloyed rods, in accordance with an embodiment of the invention, follows. To a reaction flask (typically between 50 and 250 mL, but not excluding larger flask sizes), add the following: a) magnetic stir bar; b) solvent (TOPO is preferred; other high boiling solvents are also possible, such as octadecene; c) cadmium precursor (such as cadmium oxide, but can also include cadmium formate, cadmium acetate, cadmium nitrate, cadmium stearate, and other cadmium precursors); d) Ligand 1: Long-chain phosphonic acid (generally use octadecylphosphonic acid, technical grade, 90%; other long chain phosphonic acids may work as well); e) Ligand 2: Short chain phosphonic acid (generally use hexylphosphonic acid, technical grade, 90%; other short chain phosphonic acids may work as well).

Next, heat up the reaction flask contents to 120 C under flowing UHP inert gas—the solvent will melt/liquefy and disperse other solids around 60 C—begin stirring at this point at 800 rpm and continue stirring throughout reaction. Then, de-gas this mixture at 120 C for a given time (for example, between 30 and 90 minutes depending on the metal precursors involved).

After refilling the reaction flask with inert gas, raise the temperature of the mixture to 280 C and begin the dissociation step. This step involves dissociation of metal precursors into metal-phosphonate forms. The temperature of dissociation is maintained for 70-80 minutes, until a clear, colorless solution is observed, then lower the temperature of the reaction flask to 80 C, and then let equilibrate back to 120 C.

Next, de-gas this mixture a second time at 120 C for a given time (for example, between 30 and 90 minutes depending on the metal precursors involved), then raise the temperature to 320 C and equilibrate for 15-20 minutes followed by injection of a mixture of co-ordinating ligands tri-octylphosphine (TOP) and 1,2-hexanediol (HDO). It is possible to use a variety of different 1,2-diols, long-chain mono-alcohols, and glycerol.

Lower the temperature to 300 C and then rapidly inject a mixture of: a) QD cores (CdSe binary or CdSeS ternary seeds) and b) 7.4 wt % sulfur:TOP stock solution. Simultaneously start dripping diethylzinc in 1-octadecene solution via a syringe pump. The rate of infusion may be varied depending upon how much Zn is needed to be incorporated in the ternary CdZnS shell. Allow growth to occur for 45-120 minutes (continued stirring, UHP argon flow, temperature maintained at reaction temperature of 300 C).

After a growth period, cool to room temperature (with continued stirring and continued UHP argon flow), and at temperature, T, <80 C, expose to air and inject solvent (toluene or cyclohexane); recover and stir under argon until reaction solution below 25 C.

Follow with 2× precipitation/centrifugation cycles using IPA and MeOH as antisolvents, and toluene as solvent to purify materials. The final solid product is then dissolved in organic solvent (toluene is preferred; other solvents likely possible, such as hexane, cyclohexane).

The best practice involves the following ratios:
i) Zn:Cd: (2.5-4):1
ii) Ligand 1:Ligand 2: 2.3:1
iii) Total ligand:total metal: 1.05:1
iv) Sulfur:Metal: 4:1

EXEMPLARY SYNTHETIC PROCEDURES

Example 1

Synthesis of CdSe core nanocrystals. 0.560 g (560 mg) of ODPA solid was added to a 3-neck 25 ml round-bottom flask and 6 g TOPO solid was added to the flask. 0.120 g (120 mg) of CdO solid was added to the flask. With the flask sealed and the reagents inside (CdO, ODPA, TOPO), heat the reaction to 120° C. under flowing UHP Argon gas. When the reaction mixture becomes liquid, begin stirring at 800 RPM to completely distribute the CdO and ODPA. When the temperature equilibrates at around 120° C., begin degassing the reaction mixture: Standard degas is for 30 minutes at as low a vacuum as the system can maintain, preferably between 10-30 torr. After the first degas, switch the reaction back to flowing UHP Argon gas. The temperature of the reaction was raised to 280° C. to dissociate the CdO. Dissociation is accompanied by a loss of the typical red color for CdO. After dissociation of the CdO, cool the reaction to 120° C. for the 2nd degassing step. Preferably this step is done slowly. In one embodiment this is done in increments of 40 degrees and allowed to equilibrate at each step. When the reaction mixture has cooled to about 120° C., begin the second degassing step. The second degassing is typically 1 hour at the lowest vacuum level possible. After the second degassing, switch the reaction back to flowing UHP Argon. Heat the reaction mixture. Inject 3.0 g TOP into the reaction solution as temperature increases above 280° C. Equilibrate the reaction solution at 370° C. When the reaction is equilibrated at 370° C., inject 0.836 g of 14% Se:TOP stock solution into the solution. The reaction is run until the desired visible emission from the core is achieved. For CdSe cores the time is usually between 0.5 and 10 minutes. To stop the reaction: while continuing to stir and flow UHP Argon through the reaction, rapidly cool the solution by blowing nitrogen on the outside of the flask. When the reaction temperature is around 80° C., expose the reaction solution to air and inject approximately 6 mL of toluene. Precipitate the CdSe nanocrystals through the addition of 2-propanol (IPA) to the reaction solutions. Preferably the mixture should be approximately 50/50 (by volume) reaction solution/IPA to achieve the desired precipitation. Centrifuge for 5 minutes at 6000 RPM. Redissolve the CdSe in as little toluene as possible solid (<2 mL). Precipitate the CdSe again using IPA. Centrifuge. Decant the supernatant liquid. Dissolve the CdSe solid in anhydrous toluene.

Example 2

Synthesis of CdSe/CdS core-shell nanocrystal heterostructures having PLQY>90%. Transfer 0.290 g (290 mg) of ODPA into a round bottom flask. Transfer 0.080 g (80 mg) of hexylphosphonic acid (HPA) into the flask. Transfer 3 g TOPO into the flask. Transfer 0.090 g (90 mg) of CdO solid into the reaction flask. With the flask sealed and the reagents inside (CdO, ODPA, TOPO, HPA), heat the reaction to 120° C. under flowing UHP Argon gas. When the reaction mixture becomes liquid, at about 60° C., begin stirring at 800 RPM to completely distribute the CdO, ODPA, and HPA. When the temperature settles at 120° C., begin degassing the reaction mixture. After the degas step, switch the reaction back to flowing UHP Argon gas. Raise the temperature of the reaction to 280° C. to dissociate the CdO. Increase the temperature set-point of the reaction to 320° C. Inject 1.5 g TOP into the reaction solution as temperature increases above 280° C. When the reaction is equilibrated at 320° C., inject a mixture of 1.447 g of 7.4% S:TOP stock solution and 0.235 g concentration-adjusted CdSe seed stock into the reaction solution. Immediately reduce the set point of the temperature controller to 300° C. Allow the reaction to proceed for the requisite time to necessary to produce the desired length and width of shell, yielding a rod having an aspect ratio as between 1.5 and 10, more preferably between 3 and 6. Reaction temperature for shell growth is between 120° C. and 380° C., preferably between 260° C. and 320° C., more preferably between 290° C. and 300° C.

The reaction is monitored by testing a sample to determine the absorbance at 400 nm and the at the CdSe exciton peak. Most preferably the reaction is stopped when the absorbance at 400 nm divided by the absorbance at the CdSe exciton peak is between about 25-30, but the invention contemplates that the absorbance ratio may be between about 6 and about 100, preferably between about 15-35. By "stopping the growth" it is meant that any method steps may be employed known in the art if desired and available to cease the growth of the shell. Some methods will lead to quicker cessation of shell growth than others.

Absorbance measuring may be performed by UV-VIS spectroscopic analytical method, such as a method including flow injection analysis for continuous monitoring of the reaction. In an embodiment, the reaction is stopped or arrested by removing a heating mantle and allowing the reaction vessel to cool. When the reaction temperature is around approximately 80 degrees Celsius, the reaction solution is exposed to air and approximately 4-6 mL of toluene is injected. The quantum dots are purified by transferring the reaction solution into four small centrifuge tubes, so that an equal volume is in each tube. The QDH product is precipitated through the addition of 2-propanol (IPA) to the reaction solutions. Following centrifuging, the supernatant liquid is decanted. The QDH is redissolved in as little toluene as possible (e.g., less than approximately 2 mL) and re-concentrated into one centrifuge tube. The precipitation and centrifugation steps are repeated. The final solid product is then dissolved in approximately 2 g of toluene.

Example 3

Figure 10:
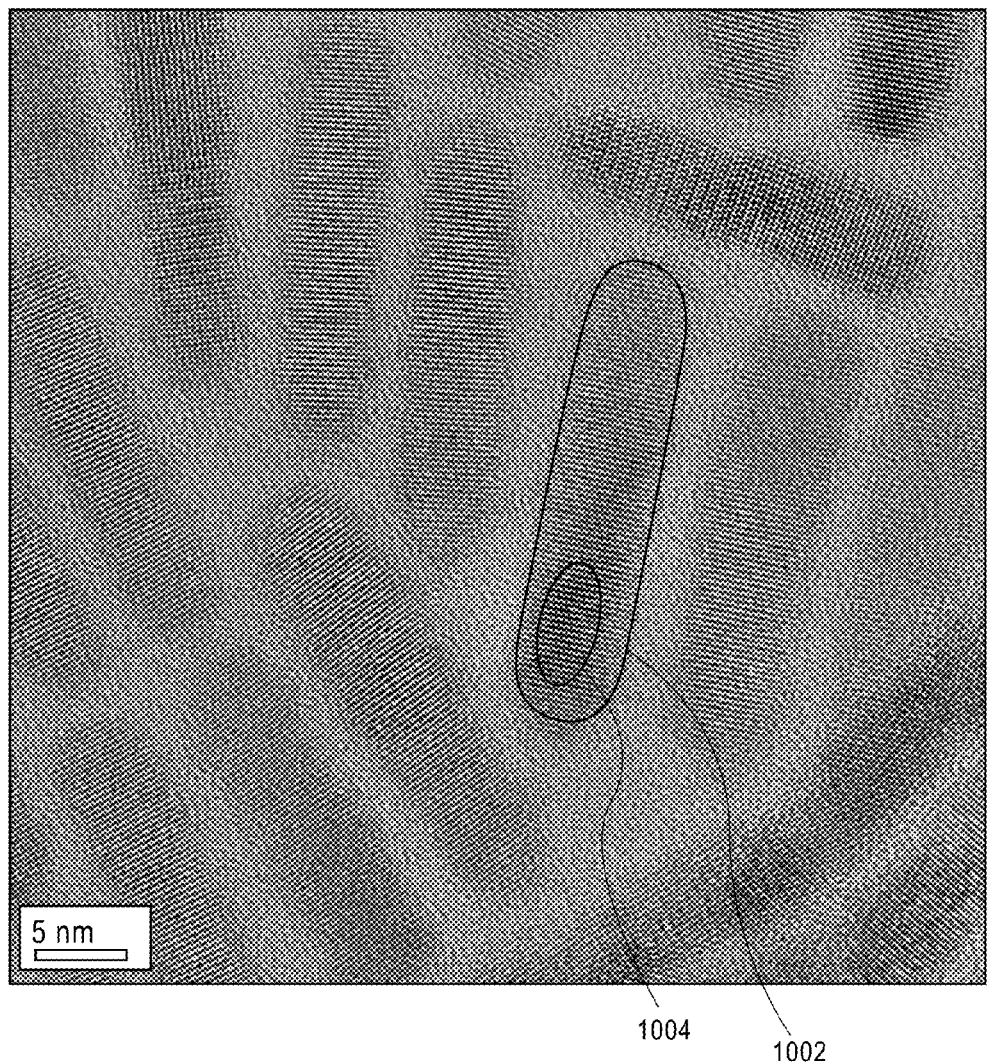
FIG. 10 is a transmission electron microscope (TEM) image of a sample of core/shell CdSe/CdS quantum dots, in accordance with an embodiment of the invention.

Synthesis of CdSe/CdS quantum dot having an absorbance ratio between 6-100. A quantum dot was fabricated according to Example 2 and having an absorbance ratio between 6-100. FIG. 10 is a transmission electron microscope (TEM) image 1000 of a sample of core/shell (1002/1004) CdSe/CdS quantum dots, in accordance with an embodiment of the invention. The TEM image 1000 indicates that there are substantially no structural defects as can be deduced from the low density of stacking faults and lack of other visible defects along the semiconductor structure 1002/1004.

Example 4

Figure 11:
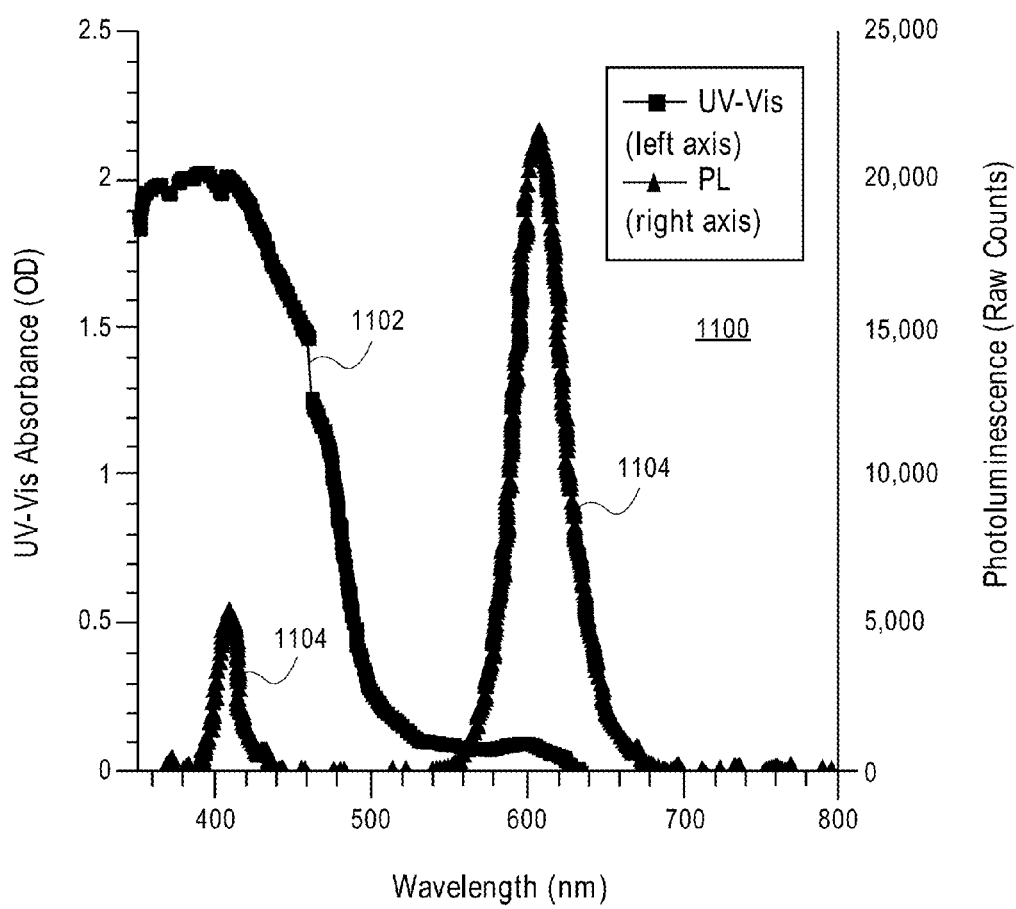
FIG. 11 is a plot including a UV-Vis absorbance spectrum and photoluminescent emission spectrum for a CdSe/CdS core/shell quantum dot having a PLQY of 96%, in accordance with an embodiment of the invention.
Figure 12:
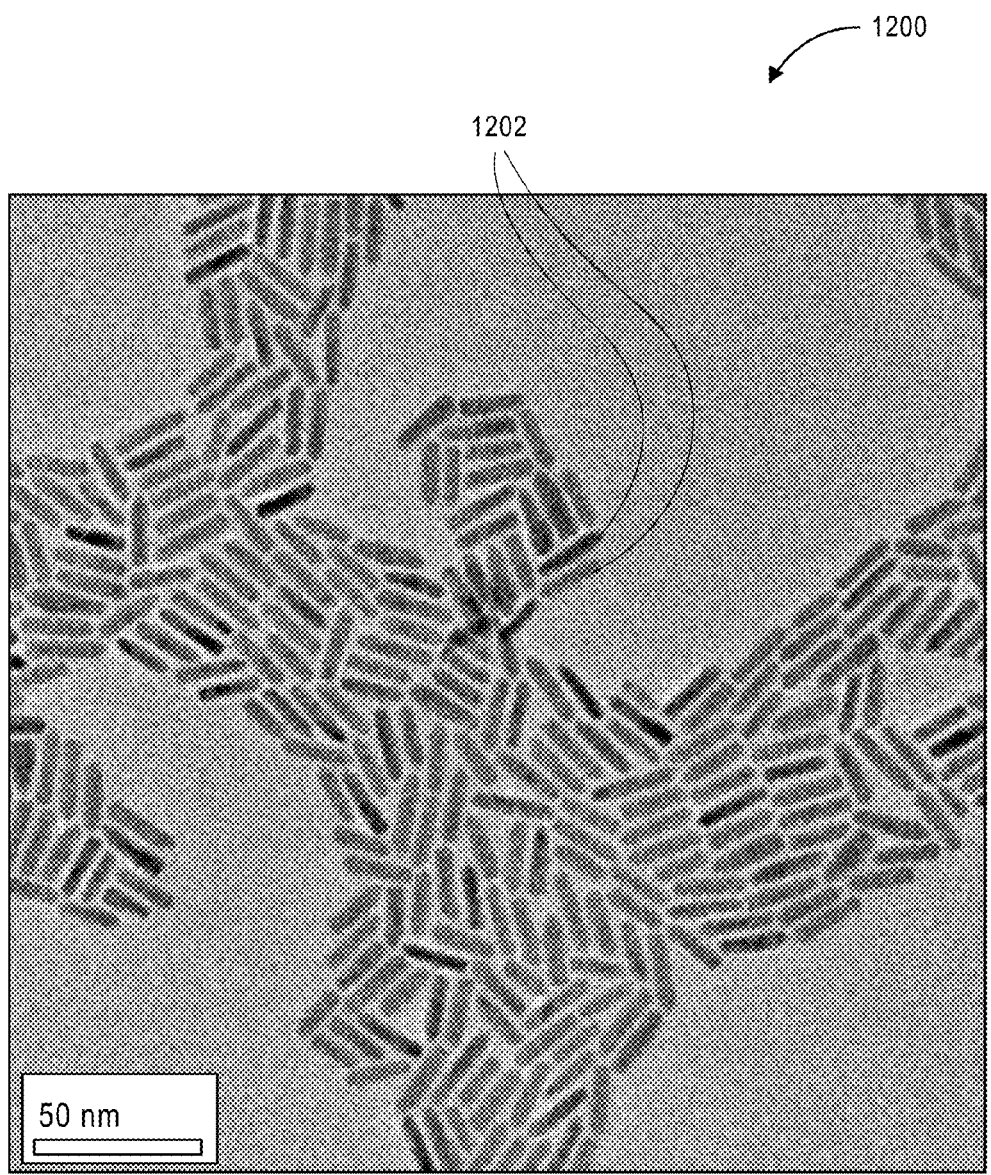
FIG. 12 is a transmission electron microscope (TEM) image of a sample of CdSe/CdS quantum dots having a PLQY of 96%, in accordance with an embodiment of the invention.

Synthesis of CdSe/CdS red quantum dot with a PLQY=96% Quantum dots were fabricated according to Example 2 and having an absorbance ratio between 6-100, and having a PLQY of 96% at 606 nm. The average length (from TEM data) is 22.3 nm±3.1 nm. The average width (from TEM data) is 6.0 nm±0.6 nm. The average aspect ratio (from TEM data) is 3.8±0.6. FIG. 11 is a plot 1100 including a UV-Vis absorbance spectrum 1102 and photoluminescent emission spectrum 1104 for a CdSe/CdS core/shell quantum dot having a PLQY of 96%, in accordance with an embodiment of the invention. The quantum dot has essentially no overlapping absorption and emission bands. FIG. 12 is a transmission electron microscope (TEM) image 1200 of a sample of CdSe/CdS quantum dots 1202 fabricated according to example 4, in accordance with an embodiment of the invention.

Example 5

Reactive Ligand Exchange for quantum dot structures 0.235 g of concentration-adjusted CdSe stock from Example 2 are exposed to a reactive exchange chemical, trimethylsilylpyrollidine (TMS-Pyr), for 20 minutes in an air-free environment and are mixed completely. After 20 minutes, an alcohol, usually 2-propanol or methanol is added to the mixture to quench the reactivity of the TMS-Pyr reagent, and to precipitate the reactively exchanged CdSe particles. The precipitated particles are centrifuged at 6000 RPM for 5 minutes. The resulting supernatant liquid is decanted and the precipitate are re-dissolved in 0.235 g of anhydrous toluene for use in the procedure described in Example 2. Reactive ligand exchange is used to introduce any number of desired surface functionalities to the surface of quantum dot cores prior to rod growth or the surface of the core/shell particles after synthesis.

Example 6

Coating semiconductor nanocrystalline core/shell pairing with silica using dioctyl sodium sulfosuccinate (AOT). Approximately 4.5 g of AOT is dissolved in 50 mL of cyclohexane. 0.5 g of QDH is precipitated w/methanol, and then re-dissolved in hexane. 20 μL of 3-aminopropyltrimethoxysilane (APTMS) is added and stirred for 30 minutes. 900 μL of NH4OH (29 wt %) is added into the solution immediately followed by 600 μL of TEOS. The solution is stirred for about 16 hrs which allows the mixture to react until a silica shell coats the nanocrystal. The silica coated particles are precipitated by MeOH and the precipitated particles are separated from the supernatant using a centrifuge. The $SiO_2$ coated particles can be re-dispersed in toluene or left in cyclohexane.

Example 7

Coating a semiconductor nanocrystal with silica using IGEPAL CO-520. Approximately 4.46 g of Igepal CO-520 (Polyoxyethylene (5) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 μL of 3-APTMS is added and stirred for about 30 minutes. 900 μL of NH4OH (29 wt %) is added into the solution immediately followed by 600 μL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 8

Methoxy silane coupling agent. Silica-shelled core-shell quantum dots are dispersed in 20 parts toluene to 1 part (MeO)3SiR (R=allyl or vinyl), and constantly stirred to allow the coupling reaction to take place. The functionalized particles are separated and cleaned by precipitation with IPA and centrifugation at 6000 rpm for 10 min. The process is repeated two or more times. Cleaned particles are dispersed in a known amount of toluene or polymer solution.

Example 9

Quantum dot/polymer preparation. To prepare the films, a known mass of quantum dots in toluene or cyclohexane is added to premade polymer solution, depending on solvent compatibility of the polymer matrix used. Other solvents may also be used for dissolution, if so desired for polarity match with the matrix or to increase or decrease the viscosity or rate of solvent evolution from the cast film.

Example 10

Film casting. The composite compositions are prepared by drop casting approximately 360 µL of QDH polymer solution onto a 12 mm glass round. The amount of quantum dots added to the polymer solution can be adjusted for different optical densities in the final QDH film. After casting films, the slow evaporation of solvent is important to give a film free of large surface imperfections. QDH-polymer solutions in toluene are allowed to evaporate in a vented fume hood. The films are cast on a level stainless plate. Once films are dried they are analyzed for PLQY and UV-Vis properties.

Example 11

The surface of silica-shelled quantum dot was functionalized using a variety of methoxy and ethoxy silanes: $(MeO)_3SiAllyl$, $(MeO)_3SiVinyl$, $(MeO)_2SiMeVinyl$, $(EtO)_3SiVinyl$, $EtOSi(Vinyl)_3$. The functionalized silica-shelled quantum dot was then used in the standard polymer formulation with additives for crosslinking, as well as without any further crosslinking co-agents such as TAIC in the case of EVA or divinylsilanes for siloxanes.

Example 12

In one embodiment, it is preferred that the olefin group is able to participate in a crosslinking process through radical mechanism in the case of EVA or through hydrosilylation process in the case of siloxanes. Allyl and vinyl are preferred, but other olefins can be included.

Example 13

In one embodiment, the degree of crosslinking may be increased using quantum dots with a higher density of the olefin groups on silica surface of quantum dots.

Example 14

Using polarity. The surface of a silica-shelled particle is modified with organo-substituted silanes in order to maximize the compatibility with a polymer matrix such as the polysiloxanes for LEDs. The silica surface is modified with organo-substituted silanes, and its properties are therefore modified by the grafted functional groups.

Example 15

Pt catalyst. A platinum-based catalyst may be introduced in Examples 9-14. In addition to the functionalized silica particles, two competing or complementary catalysts are available for cross-linking.

Example 16

Thiol catalyst. The Pt catalyst of example 15 is replaced with a thiol catalyst with a thiol-ene reaction. Di-thiols or multifunctional thiols are used. The approach enables UV curing in place of heat curing.

Example 17

Synthesis of Ternary $CdSe_nS_{n-1}$ QD seeds Trioctylphosphine oxide (TOPO), octadecylphosphonic acid (ODPA), oleylamine (OLAM), and cadmium oxide (CdO) were added into a three-neck roundbottom flask with a thermocouple probe, air condenser, and rubber septum. Under argon flow, the mixture was stirred and heated to 120° C. 1 mL toluene was added, and then the temperature was increased to 300° C. and then held for 60 minutes. The temperature was decreased to 130° C., and the vessel was evacuated until the foreline pressure decreased to at or below 50 milliTorr. The flask was purged with argon, and then the temperature was increased to 320° C., after which trioctylphosphine (TOP) was injected via syringe. The reaction solvent was heated to between 365° C. and 370° and held for a 60-minute dwell time. The heat was turned off, and a mixture of trioctylphosphine selenide (TOPSe) and sulfur oleylamine (SO-LAM) was rapidly injected after the temperature dropped to 365° C. After 30 seconds, the heating mantle and glass wool were removed and the reaction vessel was cooled down by flowing compressed air on the outside of the glass while stirring. The resulting reaction product was processed by standard procedures common in the field.

In certain embodiments, general modifications to Example 17 include one or more of (1) injecting at 320° C. and growing the nanoparticles between 280-320° C., (2) changing injection and growth temperatures anywhere between 280 and 370° C., (3) changing the sulfur to selenium ratios to tune the spectroscopic properties of the particles and modify the particle make-up and size properties, and/or (4) using different chalcogen (sulfur and/or selenium) precursors [e.g., chalcogen alkylamines, chalcogen alkenylamines (e.g., sulfur oleylamine), chalcogen alkenes (e.g., sulfur octadecene), chalcogen alkanes, trialkylphosphine chalcogenides (e.g., trioctylphosphine selenide, trioctylphosphine sulfide, and tributylphosphine sulfide), triarylphosphine chalcogenides (e.g., triphenylphosphine sulfide), dialkylphosphine chalcogenides (e.g., dioctylphosphine sulfide), diarylphosphine chalcogenides (e.g., diphenylphosphine sulfide), alkyl chalcogenols (e.g., dodecanethiol), dialkyl dichalcogenides (didodecane disulfide and dibenzyl diselenide), and bis(trialkylsilyl) chalcogenides (e.g., bis(trimethylsilyl) sulfide and bis(trimethylsilyl) selenide)].

Example 18

Synthesis of high quality ternary $CdSe_nS_{n-1}$ QD seeds for use in high performance nano-sized, semiconducting heterostructures. 1.120 g of ODPA solid was added to a 3-neck 100 ml round-bottom flask and 12 g TOPO solid was added to the flask. 0.120 g of CdO solid was added to the flask. With the flask sealed and the reagents inside (CdO, ODPA, TOPO), the reaction was heated to 120° C. under flowing UHP Argon gas. When the reaction mixture became liquid, stirring was begun at 800 RPM to completely distribute the CdO and ODPA. When the temperature equilibrated at around 120° C., degassing of the reaction mixture was begun: Standard degas was for 30 minutes at as low a vacuum as the system can maintain, preferably between 10-30 torr. After the first degas, the reaction is switched back to flowing UHP Argon gas. The temperature of the reaction was raised to 280° C. to dissociate the CdO. Dissociation was accompanied by a loss of the typical red color for CdO. After dissociation of the CdO, the reaction was cooled to 120° C. for the second degassing step. Preferably, the cooling is performed slowly. In one embodiment, the cooling was performed in increments of 40 degrees with allowing for equilibration at each step. When the reaction mixture cooled to about 120° C., the second degassing step was begun. The second degassing was typically 1 hour at the lowest vacuum level possible. After the second degassing, the reaction was switched back to flowing UHP Argon. The reaction mixture was then heated. 6.0 g TOP was injected into the reaction solution as the temperature increased above 280° C. The reaction solution was equilibrated at 370° C. When the reaction was equilibrated at 370° C., a mixed solution of 0.40 g of 14 w % Se:TOP and 1.82 g of 7.4 w % S:TOP stock solution was injected into the solution. The reaction was run in one embodiment for 400 seconds to achieve a 510 nm 1st exciton peak. To stop the reaction: while continuing to stir and flow UHP Argon through the reaction, the solution was rapidly cooled by blowing nitrogen on the outside of the flask. When the reaction temperature was around 80° C., the reaction solution was exposed to air and approximately 6 mL of toluene was injected. The nanocrystals were precipitated through the addition of 2-propanol (IPA) to the reaction solutions. Preferably the mixture should be approximately 50/50 (by volume) reaction solution/IPA to achieve the desired precipitation. Centrifuge was performed for 5 minutes at 6000 RPM. The CdSe was redissolved in as little toluene as possible solid (<2 mL). Nanocrystals were precipitated again using IPA. Centrifuge was then performed. The supernatant liquid was decanted. The solid was dissolved in anhydrous toluene.

Example 19

Synthesis of high quality ternary CdSeSn-1 QD seeds for use in high performance nano-sized, semiconducting heterostructures (using sulfur in allylamine). The same protocol as Example 18 was followed. However, when the reaction was equilibrated at 370° C., a mixed solution of (0.40 g of 14 w % Se:TOP and 0.80 g of 6.5 w % sulfur in allylamine) stock solution was injected into the solution. The protocol of Example 18 was followed to complete the reaction and isolate the quantum dots.

Example 20

Synthesis of high quality ternary $CdSe_nS_{n-1}$ QD seeds for use in high performance nano-sized, semiconducting heterostructures (using sulfur in octadecene). The same protocol as Example 18 was followed. However, when the reaction was equilibrated at 370° C., a mixed solution of (using 0.40 g of 14 w % Se:TOP and 0.80 g of 6.5 w % sulfur in octadecene) stock solution was injected into the solution. The protocol of Example 18 was followed to complete the reaction and isolate the quantum dots.

Thus, alloyed nanocrystals and quantum dots having alloyed nanocrystals have been disclosed. In accordance with an embodiment of the invention, a quantum dot includes an alloyed Group II-VI nanocrystalline core. The quantum dot also includes a Group II-VI nanocrystalline shell having a semiconductor material composition different from the alloyed Group II-VI nanocrystalline core. The Group II-VI nanocrystalline shell is bonded to and completely surrounds the alloyed Group II-VI nanocrystalline core.

What is claimed is:

1. A semiconductor structure, comprising:
    a nanocrystalline core comprising a first semiconductor material, the first semiconductor material having a first bandgap; and
    a nanocrystalline shell comprising a second semiconductor material different than the first semiconductor material at least partially surrounding the nanocrystalline core, the second semiconductor material having a second bandgap greater than the first bandgap, wherein the second semiconductor material comprises a magnesium-based semiconductor material, and wherein the second bandgap is a wide bandgap greater than 2 eV.

2. The semiconductor structure of claim 1 further comprising:
    an outer nanocrystalline shell comprising a third semiconductor material surrounding the second semiconductor material, the third semiconductor material having a third bandgap greater than the first or the second bandgap.

3. The semiconductor structure of claim 1, wherein the magnesium-based semiconductor material comprises a magnesium chalcogenide.

4. The semiconductor structure of claim 1, wherein the first bandgap and the second bandgap are nested, and a minimal mismatch of lattice constants between the core and shell exists.

5. The semiconductor structure of claim 1, wherein the magnesium-based semiconductor material is selected from a group of alloys consisting of: $Cd_nMg_{1-n}S$, $Zn_xMg_{1-x}Se$, and $Zn_mMg_{1-m}S$.

6. The semiconductor structure of claim 1, wherein the second semiconductor material exhibits a bandgap, and a bandgap alignment with the first semiconductor material, to realize a Type I heterojunction bandgap alignment with the first semiconductor material.

7. The semiconductor structure of claim 1, wherein the semiconductor structure is a Type I electronic structure, in which absorption is substantially controlled by the nanocrystalline shell, and an emission peak is substantially controlled by the nanocrystalline core.

8. The semiconductor structure of claim 2, wherein the third semiconductor material comprises another magnesium-based semiconductor material.

9. The semiconductor structure of claim 8, wherein the other magnesium-based semiconductor material is selected from a group of alloys consisting of: $Cd_nMg_{1-n}S$, $Zn_xMg_{1-x}Se$, and $Zn_mMg_{1-m}S$ .

10. The semiconductor structure of claim 3, wherein the magnesium chalcogenide is selected from a group of magnesium chalcogenides consisting of: MgO, MgS, and MgSe.

11. The semiconductor structure of claim 5, wherein the first semiconductor material is selected from a group consisting of: CdSe, and $CdSe_mS_{m-1}$.

12. The semiconductor structure of claim 7, wherein the emission peak is further controlled by a size of the nanocrystalline core, and a size of the nanocrystalline shell.

13. The semiconductor structure of claim 12, wherein the emission peak further controlled by the size of the nanocrystalline shell comprises the emission peak controlled by a diameter and a length of the nanocrystalline shell.

14. A quantum dot, comprising:
a ternary semiconductor nanocrystalline shell made of a first Group II-VI semiconductor material selected from a group consisting of: CdMgS, ZnMgSe, and ZnMgS; and
a semiconductor nanocrystalline core made of a second, different, Group II-VI semiconductor material selected from the group consisting of: CdSe, and $CdSe_mS_{1-m}$, the ternary semiconductor nanocrystalline shell bonded to and completely surrounding the semiconductor nanocrystalline core.

15. The quantum dot of claim 14, further comprising an outer shell layer encapsulating the ternary semiconductor nanocrystalline shell.

16. The quantum dot of claim 14, wherein the semiconductor nanocrystalline core is an anisotropic semiconductor nanocrystalline core.

17. The quantum dot of claim 16, wherein the anisotropic semiconductor nanocrystalline core has an aspect ratio between, but not including, 1.0 and 2.0.

* * * * *